(12) United States Patent
Shiode

(10) Patent No.: US 7,375,805 B2
(45) Date of Patent: May 20, 2008

(54) RETICLE AND OPTICAL CHARACTERISTIC MEASURING METHOD

(75) Inventor: Yoshihiro Shiode, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/614,207

(22) Filed: Dec. 21, 2006

(65) Prior Publication Data

US 2007/0097355 A1    May 3, 2007

Related U.S. Application Data

(62) Division of application No. 10/307,981, filed on Dec. 3, 2002, now Pat. No. 7,190,443.

(30) Foreign Application Priority Data

| Aug. 31, 2001 | (JP) | .............................. 2001-264581 |
| Aug. 31, 2001 | (JP) | .............................. 2001-264582 |
| Jul. 10, 2002 | (WO) | ..................... PCT/JP02/006995 |

(51) Int. Cl.
*G01B 9/00* (2006.01)

(52) U.S. Cl. ................................... 356/124

(58) Field of Classification Search ................ 356/121, 356/124, 125, 399, 401
See application file for complete search history.

(56) References Cited

U.S. PATENT DOCUMENTS

| 4,943,733 | A | * | 7/1990 | Mori et al. .................. 250/548 |
| 5,300,786 | A | * | 4/1994 | Brunner et al. ............. 250/548 |
| 5,552,856 | A | * | 9/1996 | Shiraishi et al. .............. 355/53 |
| 5,610,684 | A | * | 3/1997 | Shiraishi ....................... 355/55 |
| 5,715,089 | A | * | 2/1998 | Shiraishi ..................... 359/558 |
| 5,805,273 | A | * | 9/1998 | Unno .......................... 355/30 |
| 5,828,455 | A |   | 10/1998 | Smith et al. ................ 356/354 |
| 5,979,085 | A |   | 11/1999 | Ross et al. .................... 36/136 |

(Continued)

FOREIGN PATENT DOCUMENTS

JP    6-120116    4/1994

(Continued)

OTHER PUBLICATIONS

Chinese Official Action dated Oct. 14, 2005 issued in corresponding Chinese application No. 02816669.8, with an English language translation.

(Continued)

*Primary Examiner*—Roy M Punnoose
(74) *Attorney, Agent, or Firm*—Fitzpatrick, Cella, Harper & Scinto

(57) ABSTRACT

A wavefront aberration measuring method for measuring wavefront aberration of a projection optical system. The method includes providing a reticle having lines and spaces in which, with respect to a repetition direction thereof and from a center to a periphery, a pitch of the spaces is substantially constant while widths of the spaces gradually decrease and in which adjacent lines are not resolvable by the projection optical system, projecting light fluxes to the lines and spaces from different directions, whereby plural images of the lines and spaces are formed through the projection optical system, and detecting respective positions of the plural images and detecting, by use of the result of the detection, the wavefront aberration of the projection optical system.

6 Claims, 20 Drawing Sheets

U.S. PATENT DOCUMENTS

| | | | |
|---|---|---|---|
| 6,011,611 A * | 1/2000 | Nomura et al. | 355/67 |
| 6,320,648 B1 * | 11/2001 | Brueck et al. | 355/67 |
| 6,534,242 B2 * | 3/2003 | Sugita et al. | 430/312 |
| 6,573,015 B2 * | 6/2003 | Fujimoto | 430/30 |
| 6,613,483 B2 * | 9/2003 | Fujimoto | 430/5 |
| 6,633,390 B2 * | 10/2003 | Shiode et al. | 356/620 |
| 6,819,414 B1 * | 11/2004 | Takeuchi | 356/124 |
| 6,982,786 B2 * | 1/2006 | Shiode | 356/121 |
| 2001/0017693 A1 * | 8/2001 | Zheng et al. | 355/77 |
| 2002/0015158 A1 | 2/2002 | Shiode et al. | 356/614 |
| 2002/0122162 A1 * | 9/2002 | Nakauchi et al. | 355/52 |
| 2002/0155356 A1 * | 10/2002 | Fujimoto | 430/5 |
| 2002/0159040 A1 * | 10/2002 | Hamatani et al. | 355/52 |
| 2003/0027065 A1 | 2/2003 | Fujimoto | 430/30 |
| 2003/0197865 A1 * | 10/2003 | Shiode | 356/399 |

FOREIGN PATENT DOCUMENTS

| | | | |
|---|---|---|---|
| JP | 6120116 | * | 4/1994 |
| JP | 2001-250769 | | 9/2001 |
| JP | 2002-289494 | | 10/2002 |

OTHER PUBLICATIONS

International Preliminary Examination Report dated Jun. 11, 2003, forwarded in a Notification of Transmittal of Copies of the International Preliminary Examination Report mailed May 27, 2004, in corresponding PCT application No. PCT/JP02/06995.

Korean Official Action dated Nov. 18, 2005, issued in corresponding Korean application No. 10-2004-7003072, with a partial English translation.

International Search Report in Communication mailed Oct. 29, 2002, in corresponding PCT application No. PCT/JP02/06995.

* cited by examiner

RETICLE AND OPTICAL CHARACTERISTIC MEASURING METHOD

This application is a divisional application of U.S. patent application Ser. No. 10/307,981, filed Dec. 3, 2002 now U.S. Pat. No. 7,190,443.

FIELD OF ART

This invention relates to a reticle having a test pattern and an optical characteristic measuring method for measuring an optical characteristic of a projection optical system by use of such a reticle. More particularly, the invention is suitably usable for measurement of an optical characteristic, such as best focus position, astigmatism, curvature of field, or wavefront aberration, for example, of a projection optical system of a projection exposure apparatus used in a lithographic process, which is one process in the manufacture of semiconductor devices, liquid crystal display devices, thin-film magnetic heads, and the like.

BACKGROUND ART

The lithographic process for the manufacture of semiconductor devices, liquid crystal display devices or thin-film magnetic heads, for example, uses projection exposure apparatuses in which an image of a photomask or reticle (hereinafter, "reticle") is imaged upon a photosensitive substrate through a projection optical system. In such projection exposure apparatuses, in order to assure that the pattern of the reticle is transferred onto the photosensitive substrate at high resolution, the exposure should be carried out while the photosensitive substrate is registered with a best imaging plane (best focus plane) of the projection optical system, within the range of depth of focus. To this end, the position of the best focus plane of the projection optical system, that is, the best focus position, should be detected in accordance with some method. Further, projection optical systems have what can be called an image plane (curvature of field) in which the best focus position differs with the image height.

A known example of methods for measuring the best focus position of a projection optical system is as follows. A single pattern or plural different patterns are illuminated with two illumination lights having principal rays of different tilt angles or two illumination lights having principal rays of the same tilt angle but being incident in symmetrical directions. Then, the spacing of plural pattern images obtained thereby upon a photosensitive substrate is measured or, alternatively, a relative positional deviation between images of the plural patterns being superposed one upon another by moving the photosensitive substrate is measured. The relationship between the defocus amount and the above-described spacing or relative positional deviation is then detected and, on the basis of this relationship, the best focus is calculated. There is another known method in which the best focus position is detected without changing the position of a photosensitive substrate with respect to an optical axis direction of a projection optical system.

The above-described measurement method based on oblique incidence illumination does not need SEM measurement, and it is a method which enables simple and high-throughput and high-precision measurement of best focus position, image plane and astigmatism (astigmatic aberration). Further, the size of a pattern to be used for the above-described positional deviation measurement can be made large as compared with patterns to be used in a method of measuring positions of pattern images having phases changed between zero degrees and ninety degrees for the sake of measurement of best focus, image plane or astigmatism, which is similarly based on positional deviation measurement, or in a method of measuring a positional deviation of an interference pattern produced by interference of two light beams. Therefore, in regard to aerial image measurement, there is an advantage of no necessity of using an enlargement imaging optical system. Additionally, the above-described measurement method based on oblique incidence illumination has a large sensitivity to positional deviation with respect to defocus.

However, it has been found that the relationship between the defocus amount and the amount of positional deviation or the spacing between the pattern images obtained in accordance with the measurement method based on oblique incidence illumination, is not an utter rectilinear relation, in a strict sense. The cause thereof is that, since in the measurement based on oblique incidence illumination there occurs a shift of object spectrum position at a pupil plane, the object spectrum is cut asymmetrically by an aperture stop of a projection lens, such that asymmetrical distortion is created in an aerial image at the imaging plane.

Further, when the asymmetrical object spectrum is denoted by $A(f)$ and the OTF of the projection lens is denoted by $O(f)$, the relation with an amplitude distribution $f(x)$ of an image at the imaging plane is represented by $f(x)=F-1[A(f)\cdot O(f)]$ ($F-1$ is a Fourier inverse transform). It is seen also from this that wavefront aberration of a projection lens is influential to the aerial image.

A curve 20 in FIG. 7 is a graph wherein a positional deviation amount of a pattern (axis of abscissa) is detected with respect to defocus of a projection lens (axis of ordinate) having spherical aberration produced there. The pattern used for the focus measurement is the pattern of a conventional mark, as shown in FIG. 20. In FIG. 20, denoted at C is the length of the opening of a test pattern TP. This opening has a transmissivity nearly equal to 100%.

It is seen from FIG. 7 that, with the conventional pattern, apparently, the linearity is destroyed.

In the best focus measurement based on oblique incidence illumination in the conventional method described hereinbefore, due to a difference in wavefront aberration of a projection lens of an exposure apparatus or to a difference in wavefront aberration depending on the image height within the angle of view, the relation between the defocus amount and the positional deviation amount differs. Therefore, it is necessary to examine each time the relation between the defocus amount and the positional deviation amount or the spacing.

Further, when the relation between the defocus amount and the positional deviation amount or the spacing is approximated by a linear expression, a value of a defocus amount calculated by using an approximate expression from a positional deviation at a certain imaging plane or a spacing amount contains an error. This is a serious problem for measurement of optical characteristics of a projection optical system, where simplicity and higher precision are required in the future trend of further miniaturization of circuits.

On the other hand, aberrations of a projection lens, such as spherical aberration, image plane (curvature of field), astigmatism (astigmatic aberration), coma (coma aberration), wavefront aberration, and the like, are measured, and it is used in practical evaluation or inspection. Among these aberrations, the wavefont aberration is the aberration of concern. By approximating this wavefront aberration on the basis of a generally used Zernike polynomial, for example, aberrations such as spherical aberration, image plane, astigmatism, coma, and the like, which are factors of the polynomial, can be calculated. The measurement of wavefront aberration is also thus regarded as being important with respect to prediction, by simulation, of process margins of a large variety of device patterns.

U.S. Pat. Nos. 5,828,455 and 5,978,085, for example, propose measuring methods for wavefront aberration. In the measuring methods proposed in these patents, a grid-like pattern is formed on a reticle pattern surface while a pinhole is provided just underneath the center of the grid-like pattern with a small clearance held between them. Further, at the reticle top face, there is a special reticle having a convex lens disposed just above the center of the grid-like pattern. Where this reticle is illuminated by an illumination system of an exposure apparatus, illumination light emitted from the illumination system illuminates the grid pattern placed below it, with an illumination angle (NA) not less than a1 defined by means of the convex lens. Light passed through the grid pattern passes through the pinhole disposed below it. Here, the light which can pass through the pinhole is limited only to such light as having angles defined by connecting the pinhole and positions of respective points on the grid pattern. Therefore, light beams emitted from respective points on the grid pattern advance as plural lights having different angles.

These lights having different angles impinge at different positions on a pupil plane of the projection lens, and while being influenced by the wavefront aberration of the projection lens, they reach the wafer surface such that respective points of the grid pattern are imaged there. Here, the images of respective points of the grind pattern thus imaged have been affected by different influences of wavefront aberration (phase). More specifically, since light rays advance in the direction of a normal to the wavefront, the imaging position of the image of each point of the grid pattern shifts from an idealistic position by an amount determined by tilt of the corresponding point on the wavefront. In consideration of it, deviations of the images of respective points of the grid pattern from an idealistic grid are measured and, based on it, tilt amounts of the wavefront at respective points in the pupil plane are obtained. Then, by using various mathematical methods, the wavefront aberration is calculated.

The wavefront aberration measuring methods as proposed in the aforementioned U.S. Pat. Nos. 5,828,455 and 5,978,085 are similar to the Hartman method, well known in the art. In the Hartman method, a pinhole is disposed at a pupil plane of a projection lens thereby to restrict the wavefront position and, on the basis of a positional deviation of a pattern image formed by light passed therethrough, the tilt of the wavefront is detected.

In the Hartman method, a pinhole is placed at a pupil plane such that, in regard to the object spectrum, according to equation (1) below, due to the pinhole filter, only information related to a certain small wavefront region can be obtained.

It is desirable to positively control the shape of the object spectrum by disposing a pinhole at a pupil plane (i.e., a pupil filter), as in the Hartman method. However, in practical exposure apparatuses, this is difficult to accomplish because of the space of a barrel or of a purging structure necessary for contamination prevention, for example, and for the reason of cost.

On the other hand, in the methods as proposed in the aforementioned U.S. Pat. Nos. 5,828,455 and 5,978,085, a pinhole is provided just underneath the object surface. Thus, the object spectrum upon the pupil plane corresponds to, unlike equation (1) below, a Fourier transform including a phase term.

$$E(x) = F-1[G(f) \cdot p(f) \cdot w(f)] \quad (1)$$

F-1: Fourier inverse transform
E(x): optical amplitude function of image
G(f): object spectrum
w(f): pupil (wavefront) function
p(f): pinhole function It is an object of the present invention to provide a reticle having a test pattern by which an optical characteristic of a projection optical system can be measured very precisely, and a method of measuring an optical characteristic of a projection optical system by use of such a reticle.

Also, it is an object of the present invention to provide a reticle having a test pattern by which an optical characteristic of a projection optical system can be measured in accordance with a procedure completely different from that shown in the aforementioned two U.S. patents, and a method of measuring an optical characteristic of a projection optical system by use of such a reticle.

Particularly, it is an object of the present invention to provide a reticle having a test pattern by which at least one of best focus position, astigmatic aberration, curvature of field, and wavefront aberration of a projection optical system can be measured very precisely, and a method of measuring an optical characteristic of a projection optical system by use of such a reticle.

DISCLOSURE OF THE INVENTION

A first aspect of the present invention concerns a reticle having a test pattern for measurement of an optical characteristic of a projection optical system, and it is characterized in that said test pattern has a pattern effective to reduce or to suppress a high frequency component of a spectrum at a pupil plane of said projection optical system.

A second aspect of the present invention relates to the first aspect, and it is characterized in that said test pattern has lines and spaces adapted so that plural diffraction lights produced thereby are partially cancelled with each other at the pupil plane, thereby to reduce or to suppress the high frequency component.

A third aspect of the present invention relates to the first aspect, and it is characterized in that said test pattern has an opening for producing a predetermined periodic component at the pupil plane of said projection optical system, and periodic openings formed at opposite sides of said opening, for producing a periodic component different from said periodic component, at the pupil plane of said projection optical system.

A fourth aspect of the present invention relates to the first aspect, and it is characterized in that said projection optical system has wavefront aberration, and that said test pattern has a shape adapted so that, even when an image of said test pattern formed through said projection optical system is defocused, substantially no asymmetrical image distortion is produced.

A fifth aspect of the present invention relates to the first to fourth aspects, and it is characterized in that the optical characteristic is one or more of best focus position, astigmatic aberration and curvature of field.

A sixth aspect of the present invention concerns a reticle having a test pattern for measurement of an optical characteristic of a projection optical system, and it is characterized in that said test pattern has lines and spaces adapted so that substantially only zeroth order light is directed to an image plane of said projection optical system.

A seventh aspect of the present invention concerns a reticle having a test pattern for measurement of an optical characteristic of a projection optical system, and it is characterized in that said test pattern has lines and spaces in which, with respect to a repetition direction thereof and from a center to a periphery, a pitch of the lines is substantially constant while widths of the spaces gradually decrease.

An eighth aspect of the present invention concerns a reticle having a test pattern for measurement of an optical characteristic of a projection optical system, and it is characterized in that said test pattern has lines and spaces in which, with respect to a repetition direction thereof and from a center to a periphery, a pitch of the spaces is substantially constant while widths of the spaces gradually decrease.

A ninth aspect of the present invention relates to the seventh and eighth aspects, and it is characterized in that the lines and spaces comprise such a pattern that adjacent lines are not resolvable by said projection optical system at the time of said measurement.

A tenth aspect of the present invention relates to the first to ninth aspects, and it is characterized in that, by projecting illumination light upon a test pattern of the reticle and by detecting a position of an image of the test pattern formed thereby, an optical characteristic of the projection optical system is measured.

An eleventh aspect of the present invention relates to the first to ninth aspects, and it is characterized in that, by projecting illumination light upon a test pattern of the reticle, from one direction or plural directions, and by detecting positions of images of the test pattern formed in accordance with the projections in the plural directions, respectively, an optical characteristic of the projection optical system is measured.

A twelfth aspect of the present invention relates to the first aspect, and it is characterized in that the plural directions include two directions which are symmetrical with each other with respect to a predetermined plane containing an optical axis.

A thirteenth aspect of the present invention relates to the tenth to twelfth aspects, and it is characterized in that, where a numerical aperture of said projection optical system is NA and an incidence angle of a principal ray of the illumination light projected is $\sigma p$ ($0 \leq \sigma p \leq 1$), said test pattern is formed, with respect to object spectrum G(f) of said test pattern being orthogonal to the incidence direction of the principal ray of the illumination light, so as to cancel an amplitude of G(f) in a section f which is $[(1-2\sigma p) \cdot NA/\lambda$ to $NA/\lambda]$.

A fourteenth aspect of the present invention concerns a projection exposure apparatus, and it is characterized by a mode for measuring an optical characteristic of a projection optical system in accordance with an optical characteristic measuring method as in any one of the tenth to thirteenth aspects, by an illumination system for projecting illumination light onto a test pattern when a reticle having the test pattern is supplied into the apparatus.

A fifteenth aspect of the present invention concerns a device manufacturing method, and it is characterized by supplying a reticle for device manufacture into a projection exposure apparatus as in the fourteenth aspect, and by transferring a pattern of the reticle onto a substrate.

A sixteenth aspect of the present invention concerns a wavefront aberration measuring method for measuring wavefront aberration of a projection optical system, and it is characterized in that: a reticle having lines and spaces in which, with respect to a repetition direction thereof and from a center to a periphery, a pitch of the lines is substantially constant while widths of the spaces gradually decrease and in which adjacent lines are not resolvable by said projection optical system, is prepared, and light fluxes are projected to the lines and spaces from different directions, whereby plural images of the lines and spaces are formed through said projection optical system; and respective positions of the plural images are detected and, by use of the result of detection, the wavefront aberration of said projection optical system is detected.

A seventeenth aspect of the present invention concerns a wavefront aberration measuring method for measuring wavefront aberration of a projection optical system, and it is characterized in that: a reticle having lines and spaces in which, with respect to a repetition direction thereof and from a center to a periphery, a pitch of the spaces is substantially constant while widths of the spaces gradually decrease and in which adjacent lines are not resolvable by said projection optical system, is prepared, and light fluxes are projected to the lines and spaces from different directions, whereby plural images of the lines and spaces are formed through said projection optical system; and respective positions of the plural images are detected and, by use of the result of the detection, the wavefront aberration of said projection optical system is detected.

An eighteenth aspect of the present invention concerns a wavefront aberration measuring method for measuring wavefront aberration of a projection optical system, and it is characterized in that:

a reticle, having plural patterns each comprising lines and spaces in which, with respect to a repetition direction thereof and from a center to a periphery, a pitch of the lines is substantially constant while widths of the spaces gradually decrease and in which adjacent lines are not resolvable by said projection optical system, is prepared;

light fluxes are projected to the plural patterns from different directions, whereby plural images of the patterns are formed through said projection optical system; and respective positions of the plural pattern images are detected and, by use of the result of detection, the wavefront aberration of said projection optical system is detected.

A nineteenth aspect of the present invention concerns a wavefront aberration measuring method for measuring wavefront aberration of a projection optical system, and it is characterized in that:

a reticle, having plural patterns each comprising lines and spaces in which, with respect to a repetition direction thereof and from a center to a periphery, a pitch of the spaces is substantially constant while widths of the spaces gradually decrease and in which adjacent lines are not resolvable by said projection optical system, is prepared;

light fluxes are projected to the plural patterns from different directions, whereby plural images of the patterns are formed through said projection optical system; and respective positions of the plural pattern images are detected and, by use of the result of detection, the wavefront aberration of said projection optical system is detected.

A twentieth aspect of the present invention concerns an optical characteristic measuring method for measuring an optical characteristic of a projection optical system, and it is characterized in that:

a reticle having a test pattern is supplied while a member having an opening is supplied;

a light flux is projected to said test pattern through said opening, from an oblique direction, thereby to form an image of the pattern through said projection optical system; and a position of the pattern image is detected and, by use of the result of detection, the optical characteristic of said projection optical system is detected.

A twenty-first aspect of the present invention concerns a wavefront aberration measuring method for measuring wavefront aberration of a projection optical system, and it is characterized in that: a reticle having plural patterns is supplied while a member having an opening is supplied;

light fluxes are projected to the plural patterns through said opening, from different directions, thereby to form images of the plural patterns through said projection optical system; and respective positions of the pattern images are detected and, by use of the result of detection, the wavefront aberration of said projection optical system is detected.

A twenty-second aspect of the present invention relates to the twentieth or twenty-first aspect, and it is characterized in that the member having said opening is provided on the reticle.

A twenty-third aspect of the present invention relates to the twenty-second aspect, and it is characterized in that the reticle has a convex lens provided on said opening.

A twenty-fourth aspect of the present invention relates to the sixteenth to twenty-first aspects, and it is characterized in that the pattern has lines and spaces in which, with respect to a repetition direction thereof and from a center to a periphery, a pitch of the spaces is substantially constant while widths of the spaces gradually decrease and in which adjacent lines are not resolvable by said projection optical system.

A twenty-fifth aspect of the present invention relates to the sixteenth to twenty-first aspects, and it is characterized in that the pattern has lines and spaces adapted so that substantially only zeroth order light is directed to an image plane of said projection optical system.

A twenty-sixth aspect of the present invention relates to the sixteenth to twenty-fifth aspects, and it is characterized in that said detecting step includes a step of photoelectrically converting an aerial image of the lines and spaces.

A twenty-seventh aspect of the present invention relates to the sixteenth to twenty-fifth aspects, and it is characterized in that said detecting step includes a step of exposing a photosensitive substrate to an image of the lines and spaces and a step of developing the photosensitive substrate.

A twenty-eighth aspect of the present invention concerns a projection exposure apparatus, and it is characterized by a mode for measuring wavefront aberration of a projection optical system in accordance with a measuring method as in any one of the sixteenth to twenty-seventh aspects, and by an illumination system for projecting illumination light onto a test pattern when the reticle having the test pattern is supplied into the apparatus.

A twenty-ninth aspect of the present invention concerns a device manufacturing method, characterized by supplying a reticle for device manufacture into a projection exposure apparatus as in the twenty-eighth aspect, and by transferring a pattern of the reticle onto a substrate.

BEST FORMS FOR EMBODING THE INVENTION

Figure 1:
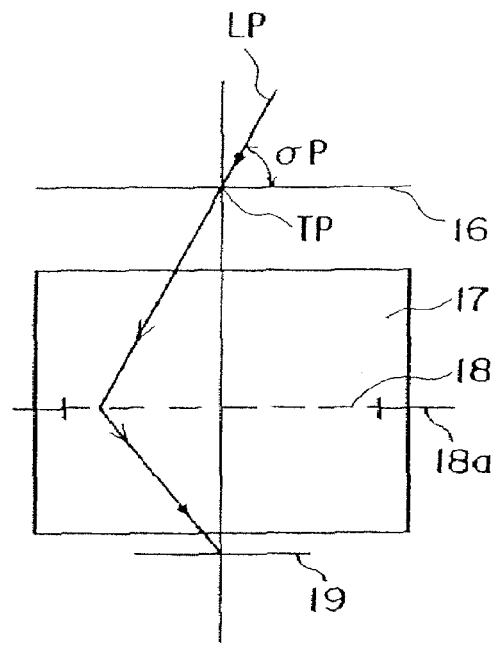
FIG. 1 is a schematic view of a main portion of a projection exposure apparatus to which an optical characteristic measuring method according to Embodiment 1 of the present invention is applied.

FIG. 1 illustrates an optical characteristic measuring method for an optical system according to Embodiment 1 of the present invention. FIG. 1 shows a case wherein, as an optical system, a projection lens 17 for projecting a pattern of a mask (reticle) 16 onto a photosensitive substrate (wafer) 19, for use in an exposure apparatus for semiconductor device manufacture, is chosen, and the present invention is applied thereto.

Figure 2:
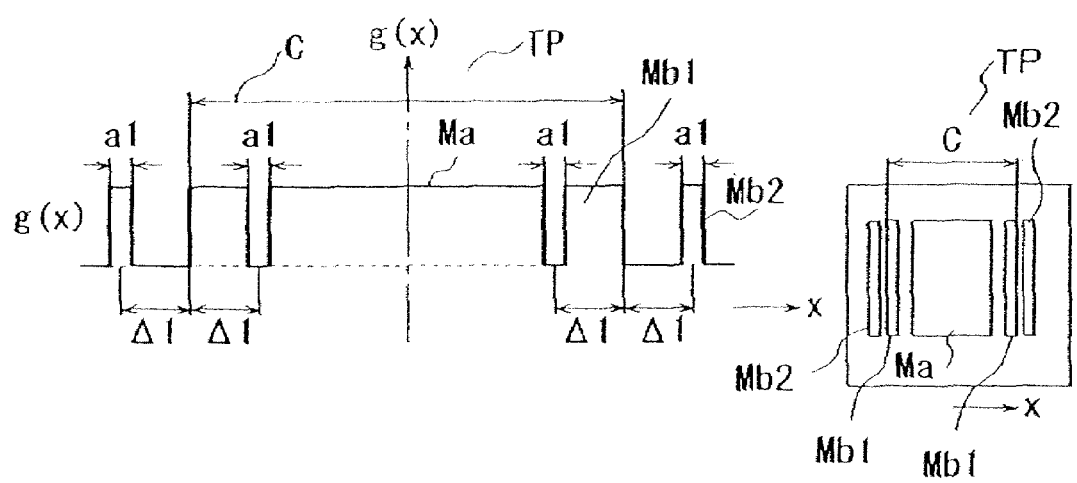
FIG. 2 illustrates a one-dimensional light intensity distribution of a test pattern according to the present invention.

In FIG. 1, the mask 16 has formed thereon a pattern, as a test pattern TP, having an intensity distribution g(x) as shown in FIG. 2, and this pattern is disposed to be orthogonal to an incidence direction (plane) of a principal ray LP of the illumination light for illuminating the pattern TP. In FIG. 2, the axis of abscissa denotes the x coordinate, while the axis of ordinate represents the intensity distribution. Patterns Ma, Mb1 and Mb2 are openings having different widths.

Diffraction light to be produced from the test pattern TP provided on the mask 16 when the same is illuminated with the illumination light LP having a tilt angle σp, passes through a projection lens 17 and enters a pupil of the projection lens. It produces object spectrum G(f) of the intensity distribution g(x) of the pattern TP, at the opening of an aperture stop 18a that defines the pupil plane 18 of the projection lens 17.

$$G(f) = C*\text{sinc}(Cf) + a1*\text{sinc}(a1f)[\exp[-i2\pi(-C/2-\Delta1)f + \exp[-i2\pi(C/2+\Delta1)f] - \exp[-i2\pi(-C/2+\Delta1)f - \exp[-i2\pi(+C/2-\Delta1)f]]$$
$$= C*\text{sinc}(Cf) + 2a1*\text{sinc}(a1f)[\cos[2\pi(C/2+\Delta1)f] - \cos[2\pi(C/2-\Delta1)f]]$$
$$= C*\text{sinc}(Cf) - 4a1*\text{sinc}(a1f)*\sin(\pi Cf)*\sin(2\pi\Delta1 f)$$
$$= A(f) - H1(f)$$

$f$: frequency
$$H1(f) = 4a1*\text{sinc}(a1f)*\sin(\pi Cf)*\sin(2\pi\Delta1 f)$$
$$A(f) = C*\text{sinc}(Cf)$$

Figure 3:
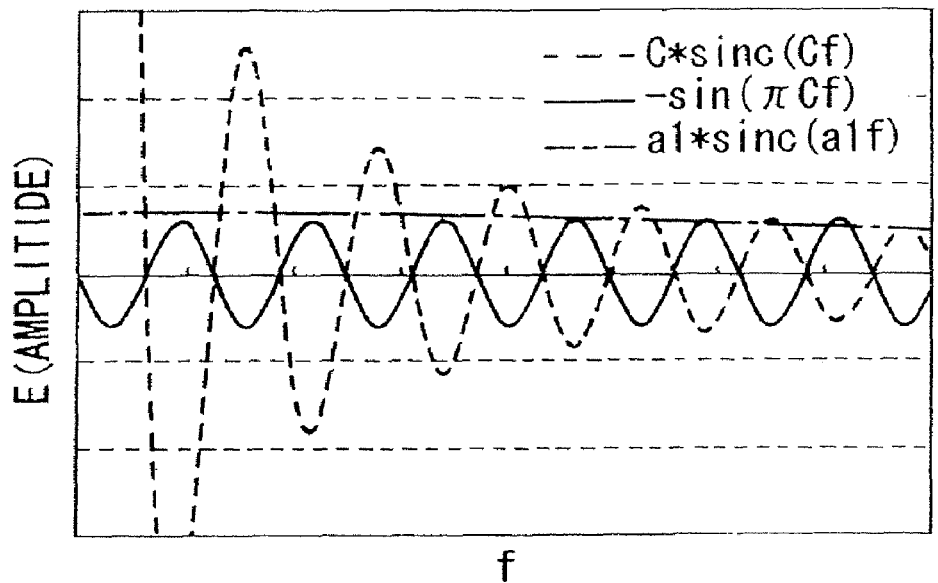
FIG. 3 illustrates a resolved object spectrum upon a pupil plane of a projection optical system.

Since $\sin(\pi Cf)$ of H1(f) has the same period as A(f), the amplitude of A(f) can be suppressed to be small throughout the whole frequency region. Also, as regards $4a1*\text{sinc}(a1f)$ of H1(f), if a sufficiently small value a1 that satisfies $1/(2a1) \geq (1+\sigma p) \cdot NA0/\lambda$ is chosen relative to NA0 at the light entrance side of the projection lens 17 (pupil 18), then, within the region of pupil plane 18 of the projection lens 17, $4a1*\text{sinc}(a1f)$ can be regarded as a mere weight function, which decreases as the frequency becomes high. FIG. 3 illustrates actions of A(f), $\sin(\pi Cf)$ and $4a1*\text{sinc}(a1f)$ described above.

Figure 4:
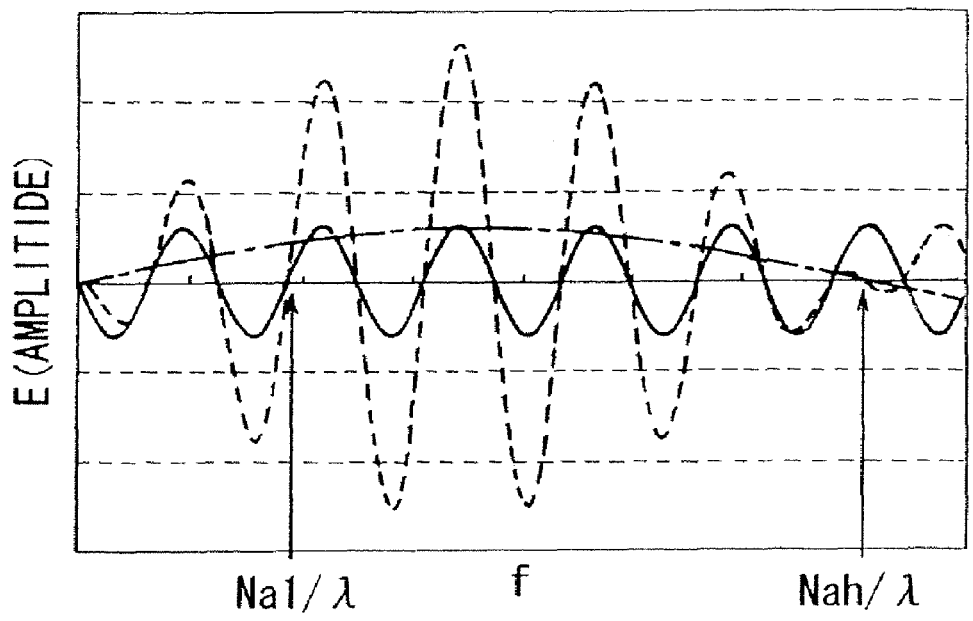
FIG. 4 illustrates a resolved object spectrum upon a pupil plane of a projection optical system. with the following.

As regards $\sin(2\pi\Delta1 f)$ of H1(f), similarly, if a half period of $\sin(2\pi\Delta1 f)$ is given as not less than the region of the pupil plane 18 of the projection lens 17, it becomes a mere weight function having a maximum value. The condition therefor is $1/(2\Delta1)<(1+\sigma p) \cdot NA0/\lambda$. FIG. 4 illustrates actions of H1(f), $\sin(\pi Cf)$ and $\sin(2\pi\Delta1 f)$ described above.

Figure 5:
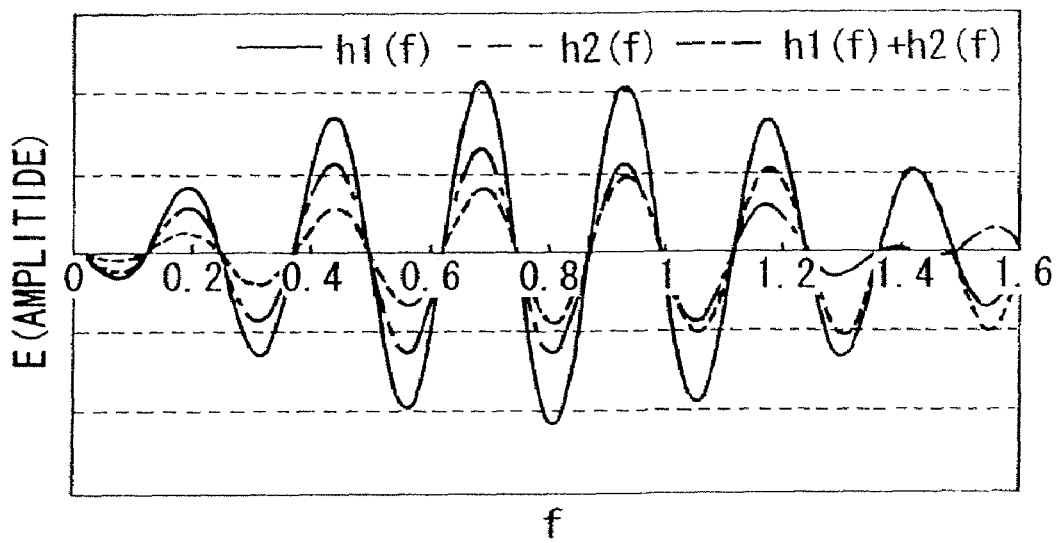
FIG. 5 illustrates an object spectrum upon a pupil plane of a projection optical system.

By optimizing a1 and Δ1, H1(f) can be shaped, and, on the basis of it, it is possible to obtain G(f) with which the amplitude of the high-frequency component of A(f), which should be suppressed to be made as small as possible, can be suppressed to be small within an appropriate frequency region. Also, as regards a1 and Δ1, similarly, by adding pattern shaping such as a2 and Δ2, optimization based on H1(f)+H2(f) is enabled. FIG. 5 illustrates that, through the shaping by two sets of H1(f) and H2(f), the attenuation tendency of the amplitude in the high frequency components of the sum of H1(f)+H2(f) is consistent more with the tendency of A(f). Similarly, optimization based on H1(f)+H2(f) . . . +Hn(f) is possible.

The object spectrum G(f) of the test pattern TP shown in FIG. 2, as produced on the basis of a1 and Δ1 satisfying the above-described condition, is imaged at the imaging plane 19 while being influenced by wavefront aberration of the projection lens 17 and the position of the imaging plane 19. The amplitude distribution f(x) of the image here is:

$$f(x) = F{-1}[G(f) \cdot O(f)]$$

Since, upon the pupil plane 18, the object spectrum G(f) has an amplitude only in a circular region having a size (radius) 1-σp about a center at a position σp, corresponding to the tile angle σp of the principal ray LP of the illumination light, it follows from the aforementioned equation that the imaging amplitude f(x) is influenced only by the wavefront aberration of the projection lens 17 in a small region (region 25 in FIG. 6) on the pupil plane 18. By setting this small region with an appropriate size, since a change in wavefront aberration due to defocus affects only the lower-order frequencies in the small region, distortion of the image can be reduced to be small. Therefore, as regards the relationship of any positional change of the image relative to the defocus, it is not influenced by image distortion and it is linear. More specifically, since the test pattern TP directs substantially only zeroth order light toward the image plane, through the pupil plane of the projection optical system, the relationship of the positional change in the image to the defocus becomes substantially linear.

Figure 21:
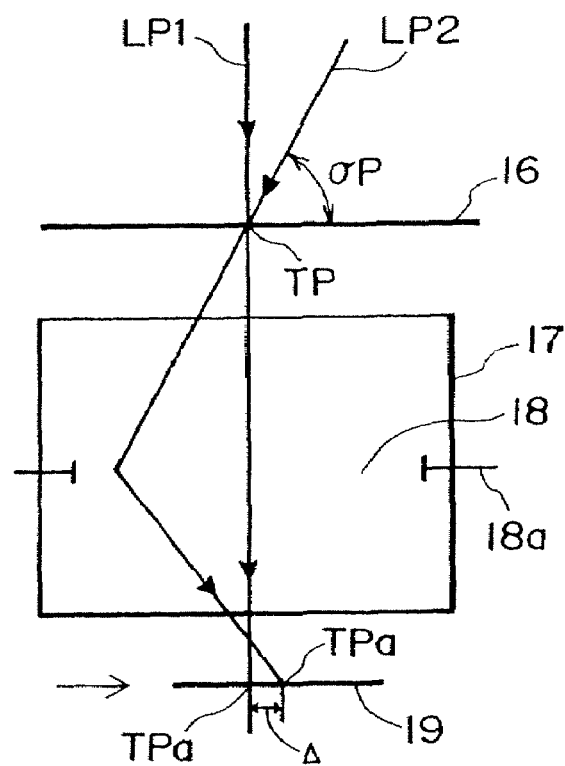
FIG. 21 illustrates a lateral deviation of a pattern according to the present invention.

FIG. 21 shows a projection exposure apparatus for projecting and transferring a pattern of a mask 16 onto a photosensitive substrate 19, in which two illumination lights having principal rays LP1 and LP2 with different incidence angles (tilt angles) are projected on a test pattern TP (see FIG. 2) on a mask 16, in which two images TPa of the test pattern are transferred by the projection optical system 17 onto the photosensitive substrate 19 on a wafer stage, in which a positional deviation Δ between the two pattern images TPa within the plane of incidence (sheet of the drawing) upon the photosensitive substrate 19 and with respect to a direction of an arrow, is measured, and in which, on the basis of the positional deviation Δ, the best focus is detected.

In this embodiment, the pattern shape of the test pattern TP is designed so as to assure that, regardless of the defocus and wavefront aberration of the projection optical system, the relation of the positional deviation of the pattern image relative to the defocus can hold its linearity.

Figure 6:
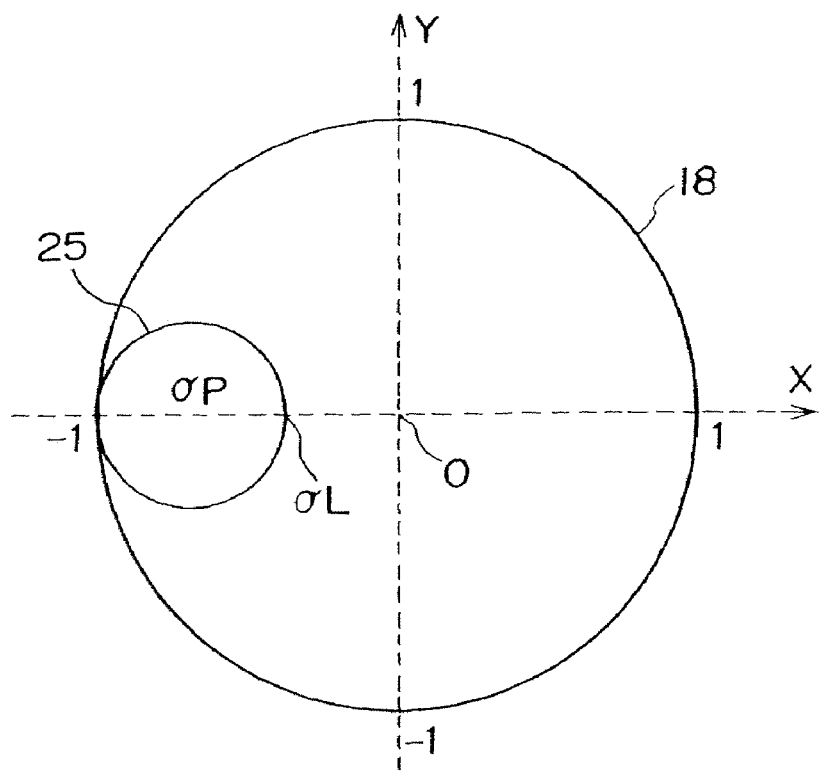
FIG. 6 illustrates a pupil plane of a projection optical system.

FIG. 6 shows the coordinates (pupil coordinates) on the pupil plane 18 of the projection lens 17. The X and Y axes are axes which pass through the center 0 of the pupil, respectively, and the coordinates represent values having been standardized with respect to the numerical aperture NA0 (radius of pupil plane) of the projection lens 17. At the pupil plane 18 of the projection lens 17, the incidence position −σp of the principal ray LP is displaced from the pupil center 0. Simulations were carried out in accordance with conventional marks and by use of a pupil filter arranged so that light could pass through only a smallest circle 25, which could be drawn about the incidence position −σp, while abutting on the boundary of the pupil plane 18. Curve 121 in FIG. 7 shows the results thereof.

Figure 7:
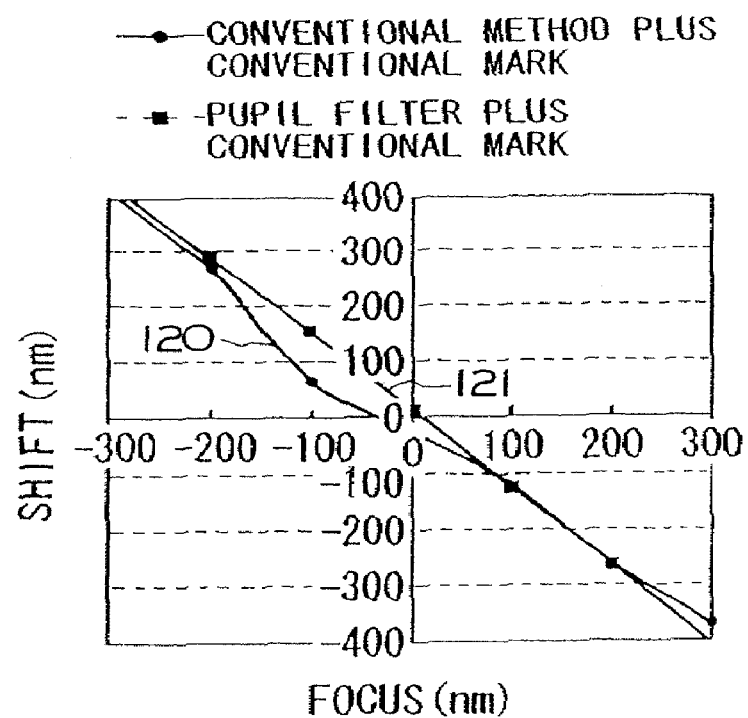
FIG. 7 illustrates a relation between an optical axis direction (Z position) and lateral deviation of a pattern.
Figure 8:
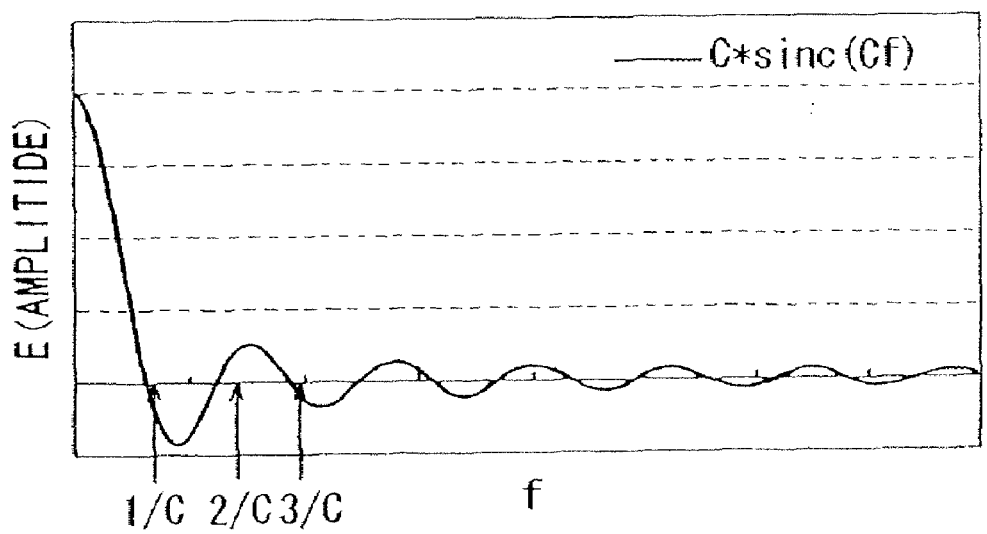
FIG. 8 illustrates an object spectrum on a pupil plane of a projection optical system.
Figure 20:
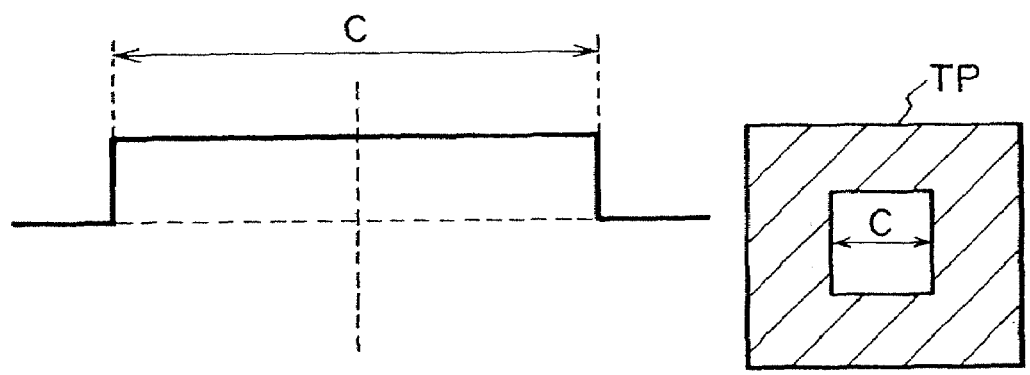
FIG. 20 illustrates a one-dimensional light intensity distribution of an object image.

Clearly, as compared with a curve 120 provided by the conventional method without using the pupil filter of FIG. 7, the curve 121 is improved in its straightness. This can be understood as being accomplished by the high frequency components [−(1−σp)·NA0/λ to (1+σp)·NA0/λ] of the object spectrum (f>0) of the test pattern TP shown in FIGS. 20 being all intercepted by means of the pupil filter such as shown in FIG. 8, and by the amplitude of the object spectrum at the pupil plane 18 being made laterally symmetrical with respect to the position σp of the principal ray of the illumination light upon the pupil plane 18.

As described above, in this embodiment, the test pattern TP is optimized so that the amplitude in the high frequency components of the object spectrum G(f) of the test pattern TP is suppressed or cancelled within the above-described section [−(1−σp)·NA0/λ to (1+σp)·NA0/λ] and, on the basis of it, an effect similar to that of a pupil filter is obtained. More specifically, this embodiment uses a test pattern which is optimized so that, in relation to a numerical aperture NA of the projection optical system and an incidence angle ap (0≦σp≦1 at positions in the pupil plane) of the principal ray of the illumination light which illuminates the test pattern TP, and with respect to object spectrum G(f) of the test pattern being orthogonal to the incidence direction of the principal ray of the illumination light, the amplitude of G(f) in the section f, which is [(1−2σp)·NA/λ to NA/λ], is cancelled.

Figure 9:
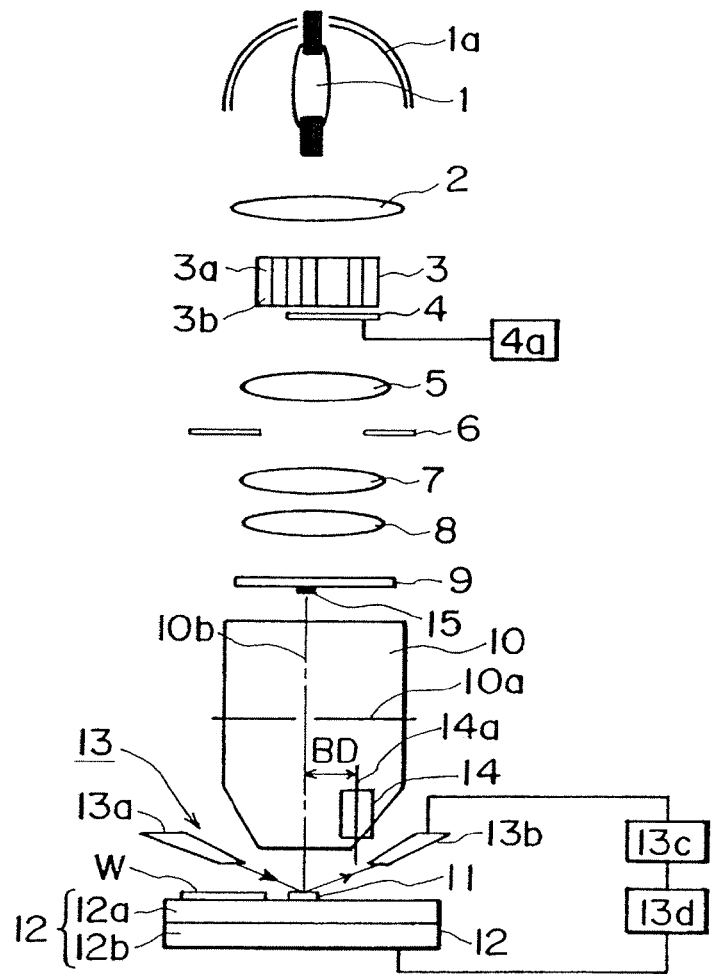
FIG. 9 is a schematic view of a main portion of a projection exposure apparatus according to Embodiment 2 of the present invention.

FIG. 9 is a schematic view of a main portion of a projection exposure apparatus according to Embodiment 2 of the present invention, into which a reticle having a test pattern is to be supplied. In Embodiment 2 a description will be made of a best focus measuring method and an image plane measuring method for a projection optical system in an exposure apparatus. This embodiment is applicable not only to a lens system, but also to a projection optical system having a mirror system or to a projection optical system (catadioptric system) having a combination of lens and mirror systems.

In FIG. 9, denoted at 1 is a light source (light source means) for exposure light. As regards the light source 1, a high pressure Hg lamp or an excimer laser light source, for example, may be used. When a high pressure Hg lamp is used, exposure light emitting from the light source 1 is collected by an elliptical mirror 1a and, after it, the light passes through an input lens 2 and enters a light entrance surface 3a of a fly's eye lens 3. A large number of secondary light sources are produced at a rear (reticle side) focal surface of the fly's eye lens 3, which surface is a light exit surface 3b thereof. Exposure light emitted from these secondary light sources advances via aperture stop 4, first relay lens 5, projection type reticle blind 6, second relay lens 7, and main condenser lens 8, and it illuminates a reticle 9 with uniform illuminance. The projection type reticle blind 6 and the pattern bearing surface of the reticle 9 are disposed conjugate with each other, such that the projection type reticle blind 6 defines an illumination region on the reticle 9. The pattern of the reticle 9 is projected by a projection optical system 10 onto a photosensitive material (wafer) W.

Figure 10:
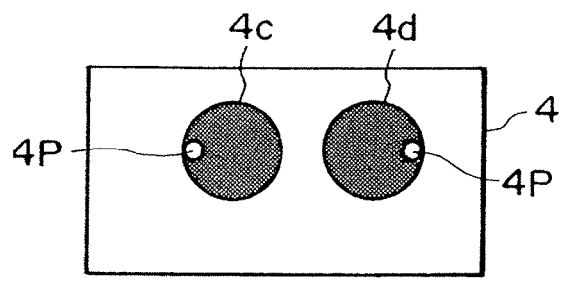
FIG. 10 illustrates a portion of FIG. 9.

The aperture stop 4 to be used for a measurement mode is arranged so that, by means of a switching mechanism 4a, aperture stops 4c and 4d shown in FIG. 10 can be used interchangeably. Alternatively, it is provided by a variable aperture stop such that an aperture 4p can be defined at an arbitrary position and with an arbitrary size.

Figure 11:
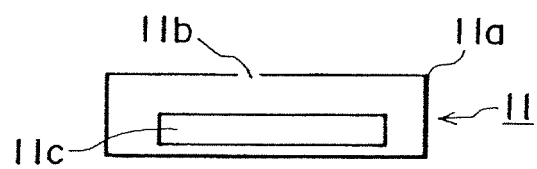
FIG. 11 illustrates a portion of FIG. 9.

An image of a test pattern 15, which is formed on the pattern bearing surface of the reticle 9 as illuminated with exposure light, is imaged on a plate 11a constituting a detection system 11 such as shown in FIG. 11. The plate 11a is mounted on a wafer stage 12. The rear focal surface 3b of the fly's eye lens 3 is approximately conjugate with a pupil plane 10a of the projection optical system 10. The plate 11a has a slit 11b formed therein, and light passed through the slit 11b is received by a photoreceptor 11c, whereby it is detected (photoelectric conversion). The detection system 11 (detection unit), comprising plate 11a, slit 11b and photoreceptor 11c, is mounted on the wafer stage 12. The wafer stage 12 comprises an X-Y stage 12a for positioning the detection system 11 at an arbitrary position within a plane perpendicular to an optical axis 10b of the projection optical system 10, a Z stage 12b being movable upwardly and downwardly in a direction parallel to the optical axis 10b of the projection optical system 10, thereby to set the focus position of the detector 11, and so on.

In this embodiment, there is an autofocus system 13 for detecting the focus position of the detection system 11 (plate 11a). The autofocus system 13 comprises a light sending system 13a for projecting an image of a slit-like light pattern, for example, onto the top surface of the plate 11a obliquely with respect to the optical axis 10b of the projection optical system 10, as well as a light receiving system 13b for receiving reflection light from the top surface of the plate 11a to re-image the image of the light slit-like light pattern.

If the focus position (position in the optical axis 10b direction) of the top surface of the plate 11a changes, in the light receiving system 13b the position of the image of the slit-like light pattern as re-imaged on a light receiving plane changes. Thus, by detecting the imaging position of the slit-like light pattern, any change in the focus position can be detected.

The light receiving system has a photoelectric detector 13c incorporated therein to produce a focus signal which changes in accordance with the position of the slit-like light pattern as re-imaged. A control system 13d drives the Z stage 12b of the wafer stage 12 so that the focus signal from the photoelectric detector 13c is maintained at a predetermined level. By this, the focus position of the top surface of the plate 11a can be held at a predetermined position (image plane position of the projection optical system), or it can be shifted from that position.

The focus signal from the photoelectric detector 13c changes substantially linearly, with a change in focus position of the top surface of the plate 11a within a predetermined range (a predetermined range in the optical axis 10b direction). Therefore, inversely, a change in focus position can be detected from a change in level of the focus signal. Further, the Z stage 12b of the wafer stage 12 has incorporated therein a height sensor (not shown) for detecting the position of the Z stage 12b with respect to the optical axis 10b direction of the projection optical system 10.

Denoted at 14 is an off-axis wafer alignment system. The wafer alignment system 14 detects alignment marks formed adjacent to respective shot regions of the waferW. In this case, by detecting beforehand the spacing between the optical axis 10b and the detection center 14b of the wafer alignment system 14, that is, what is called a baseline length BD, accurate alignment of each shot region of the wafer 11 can be carried out on the basis of the alignment mark position measured by the wafer alignment system 14. Further, the wafer alignment system 14 is operable also to detect various marks.

Figure 12:
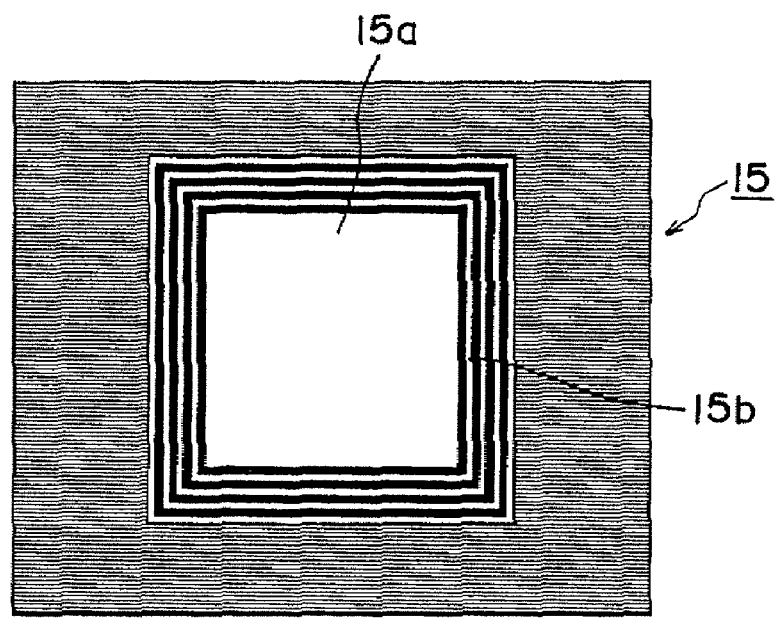
FIG. 12 illustrates a test pattern according to the present invention.
Figure 13:
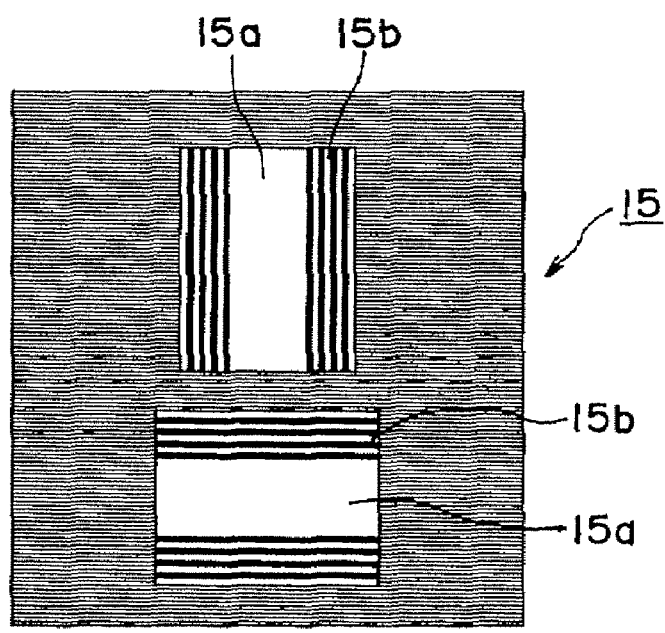
FIG. 13 illustrates a test pattern according to the present invention.

Formed on the pattern bearing surface (bottom face) of the reticle 9 is a test pattern 15. As regards this test pattern 15, a pattern shown in FIG. 12 or a pattern such as shown in FIG. 13, for example, is used. In FIGS. 12 and 13, an opening 15a of the test pattern 15 is a pattern which is to be resolved by the projection lens 10 of the apparatus shown in FIG. 9. Periodic openings 15b formed around or at the opposite sides of the opening 15a are patterns not resolvable by the projection lens 10.

The best focus measuring method for the projection lens 10 of the projection exposure apparatus, using the reticle 9 having the test pattern 15, is as follows.

Figure 14:
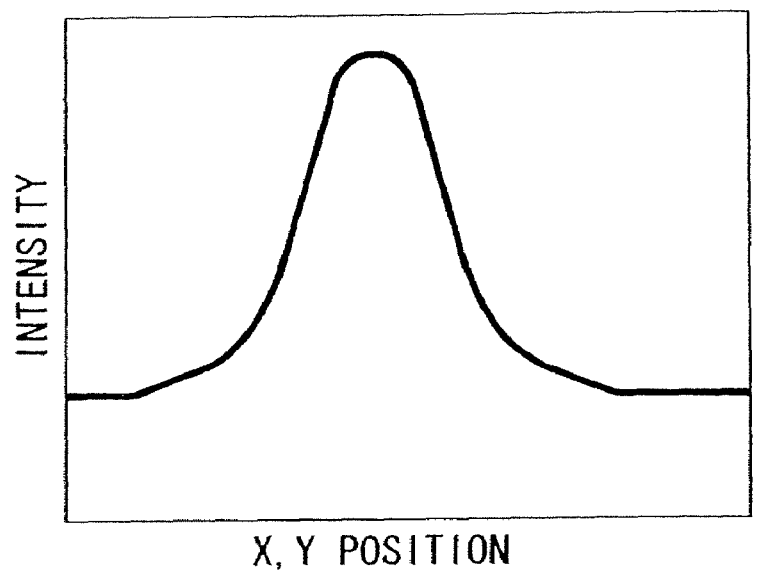
FIG. 14 illustrates a light intensity distribution on a test pattern projection plane.

To the test pattern 15, a first illumination light defined by an aperture stop 4c shown in FIG. 10 is projected from a predetermined direction, and an image of the test pattern 15 is projected onto a plate 11a which is mounted on the wafer stage 12, through the projection optical system 10. By moving the wafer stage 12 along a plane (X and Y directions) orthogonal to the optical axis direction and in a direction parallel to the plane of incidence of the aforementioned first illumination light, a slit pattern 11b provided on the plate 11a is scanned. Light passed through this slit pattern is detected by using a photoreceptor 11c such as a light intensity detector or a light quantity detector, for example. Then, on the basis of respective positions (X, Y) of the wafer stage 12 in the plane (X and Y directions) orthogonal to the optical axis direction, obtained at that time, and of detection signals (FIG. 14) corresponding to the light intensity or the light quantity at these positions, the central position of the image of the test pattern 15 being imaged upon the plate 11a is calculated.

Thereafter, the stage 12b is moved in the Z direction, and the aperture stop 14c is interchanged by the aperture stop 14d. Then, second illumination light whose principal ray has the same tilt angle as the first illumination light but has a direction of incidence being symmetrical with the first illumination light, is projected on the test pattern 15. By this, an image of the test pattern 15 is projected on the plate 11a mounted on the wafer stage 12, through the projection optical system 10. By moving the wafer stage 12 along a plane (X and Y directions) orthogonal to the optical axis direction and in a direction parallel to the plane of incidence of the aforementioned second illumination light, the slit pattern 11b provided on the plate 11a is scanned. Light passed through this slit pattern is detected by use of the photoreceptor 11c such as a light intensity detector or a light quantity detector, for example. Then, on the basis of respective positions (X, Y) of the wafer stage 12 in the plane (X and Y directions) orthogonal to the optical axis direction, obtained at that time, and of detection signals (FIG. 14) corresponding to the light intensity or the light quantity at these positions, the central position of the image of the test pattern 15 being imaged upon the plate 11a is calculated.

With the provision of a process for calculating the central position of the image of the test pattern 15 at each of different Z positions as described above, since the relationship between the Z position (focus) and the calculated central position of the test pattern image (shift amount of lateral deviation) is approximately linear, linear approximation may be carried out in regard to each of the relationships between the Z position and the central position of the test pattern image as calculated on the basis of test pattern images provided by use of two different illumination lights described above. Also, the Z position where the thus obtained two straight lines intersect with each other may be automatically detected as the best focus position. Further, the result above may be fed back to the exposure apparatus, by which automatic correction of the focus position is attainable. Further, since the light pattern of an aerial image of the test pattern 15 is sufficiently large as a few microns, in place of the light intensity detector or the light quantity detector which requires stage scan as described above, a light receiving surface of a CCD or a linear sensor may be directly set at the imaging plane to receive the aerial image, without incorporating an enlarging optical system into the stage. By detecting the central position of this aerial image, the best focus position can be calculated.

Further, test patterns 15 as described may be formed on one and the same reticle, at plural locations having different heights (image heights) from the optical axis. Test pattern exposures may be carried out with respect to different image heights in accordance with the procedure described hereinbefore, and, in relation to each image height, the best focus position may be detected. This enables measurement of image plane (curvature of field). Furthermore, the direction of opening of the aperture stops 4c and 4d may be rotated by 90 deg. and similar measurement may be carried out. This enables measurement of astigmatism (astigmatic aberration). By actuating a correction optical system provided inside the projection optical system 10, automatic correction of various aberrations such as described above can be accomplished. Such automatic correction is enabled by performing measurement of detected data in a signal processing system (not shown) of the apparatus and by feeding back the result to a correction optical system driving mechanism (not shown).

Next, a description will be made of Embodiment 3 of the present invention.

As compared with Embodiment 2, Embodiment 3 differs only in the point of the pattern shape of the test pattern. The remaining portion has the same structure as that of Embodiment 2.

In Embodiment 3, a description will be made of a specific example of calculating the best focus from the result of transfer of a test pattern onto a photosensitive substrate (wafer) W.

Figure 15:
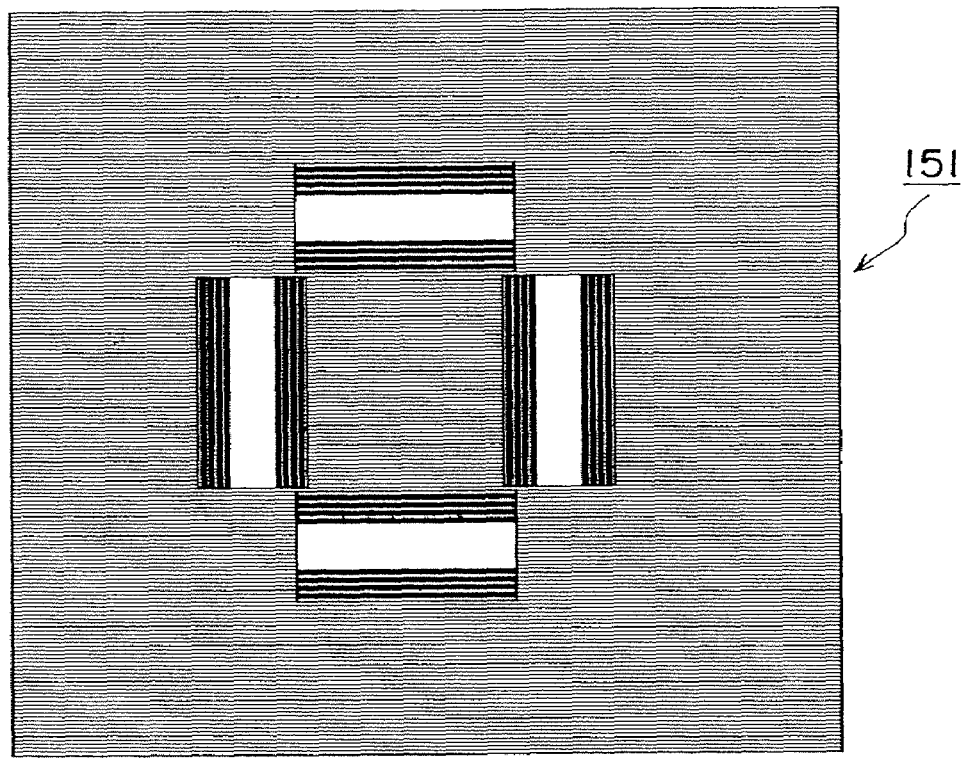
FIG. 15 illustrates an example of a test pattern according to Embodiment 3 of the present invention.
Figure 16:
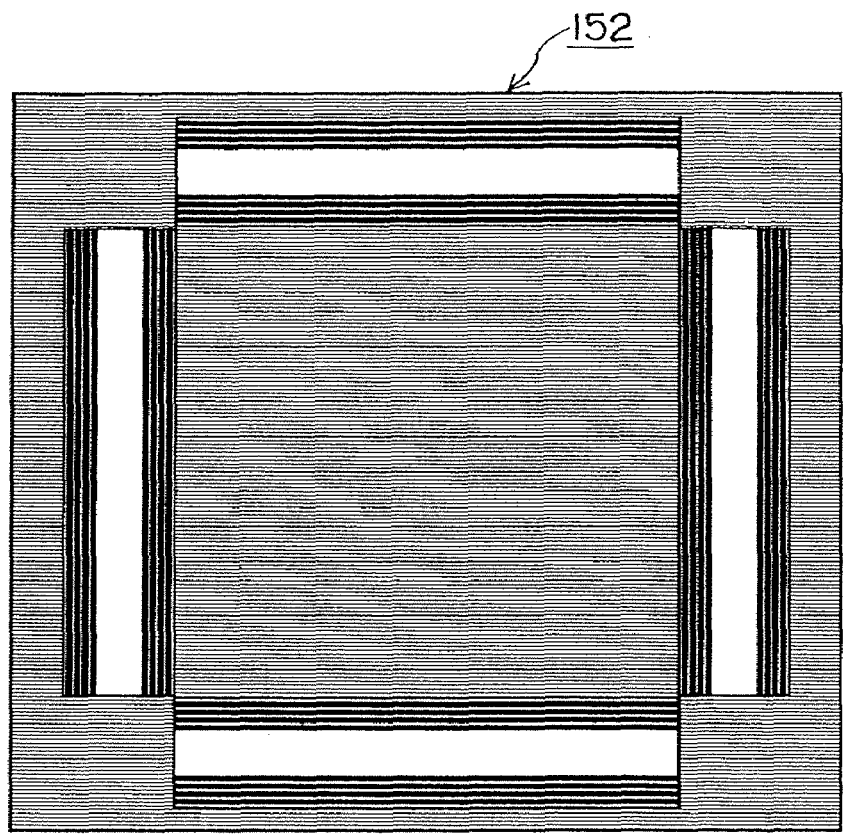
FIG. 16 illustrates another example of a test pattern according to Embodiment 3 of the present invention.
Figure 17:
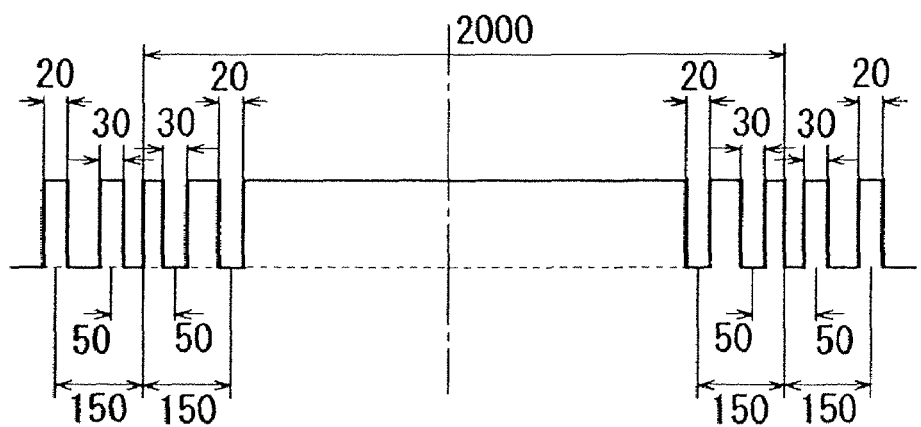
FIG. 17 illustrates a one-dimensional light intensity distribution of a test pattern according to Embodiment 3 of the present invention.

In order to inspect the shift amount of lateral deviation of a test pattern image, a distance between two patterns should be inspected. The pattern to be used differs from that of Embodiment 1, and a positional deviation between superposed marks is measured. FIGS. 15 and 16 show pattern examples for two types of test patterns, which are going to be used in this embodiment. The lines in four directions shown in the test pattern 151 of FIG. 15 and the lines in four directions shown in the test pattern 152 of FIG. 16 are designed with the same linewidth. Also, as regards the mask used, what is called a binary mask as having no phase difference is used. However, a mask having a phase difference may be used. FIG. 17 illustrates the size and sectional view in the linewidth direction of each of the test patterns of FIGS. 15 and 16. The sizes illustrated in the drawing are all the sizes (mm) in terms of being converted at the imaging side (photosensitive substrate W side).

Figure 18:
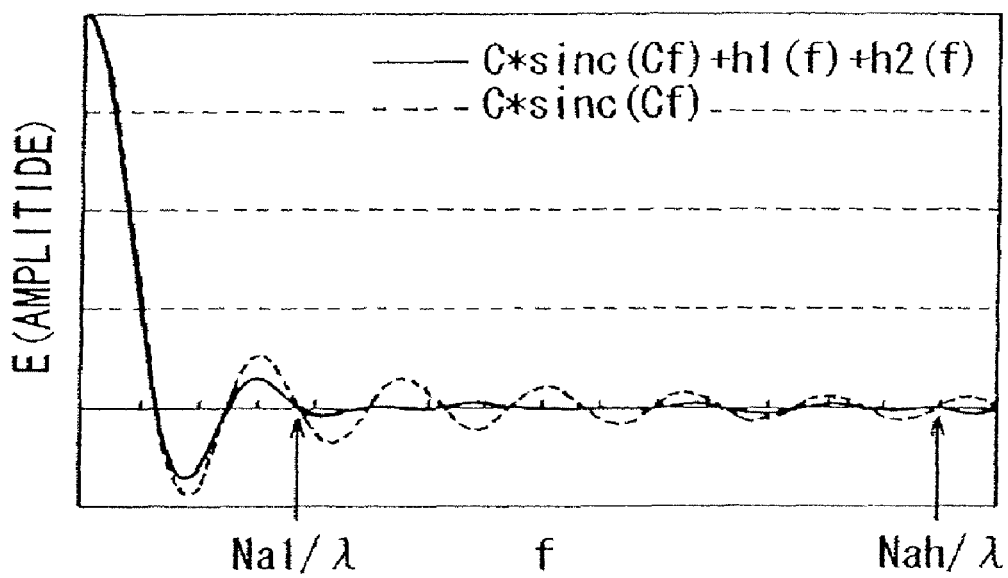
FIG. 18 illustrates an object spectrum on a pupil plane of a projection optical system.

FIG. 18 illustrates a comparison between the object spectrum (solid line) of the pattern of FIG. 17 and the object spectrum (broken line) of the pattern in which the pattern width C in FIG. 2 is set to two microns. It is seen that, in the numerical aperture (NA) region Na1-Nah for which optimization should be carried out, the amplitude of the pattern of FIG. 17 is suppressed to be small. The numerical aperture (NA) of the projection lens used was 0.7, the incidence angle σp of oblique incidence of each illumination light was 0.7, and the σ size corresponding to an opening angle of the illumination light was 0.1.

By using the aperture stop 4c, the photosensitive substrate is exposed with patterns 151 and 152. Thereafter, the wafer stage is moved so that images of the patterns 151 and 152 are superposed one upon another. Then, the aperture stop 4c is interchanged by the aperture stop 4d and, by using the aperture stop 4d, the photosensitive substrate is exposed with the patterns 151 and 152. Subsequently, by using a measuring tool, a relative positional deviation between the images of the exposed patterns 151 and 152 is measured. Here, if it is defined that the shift of the pattern image is zero with the best focus position, a focus deviation can be represented by an amount of positional deviation between pattern images.

Figure 19:
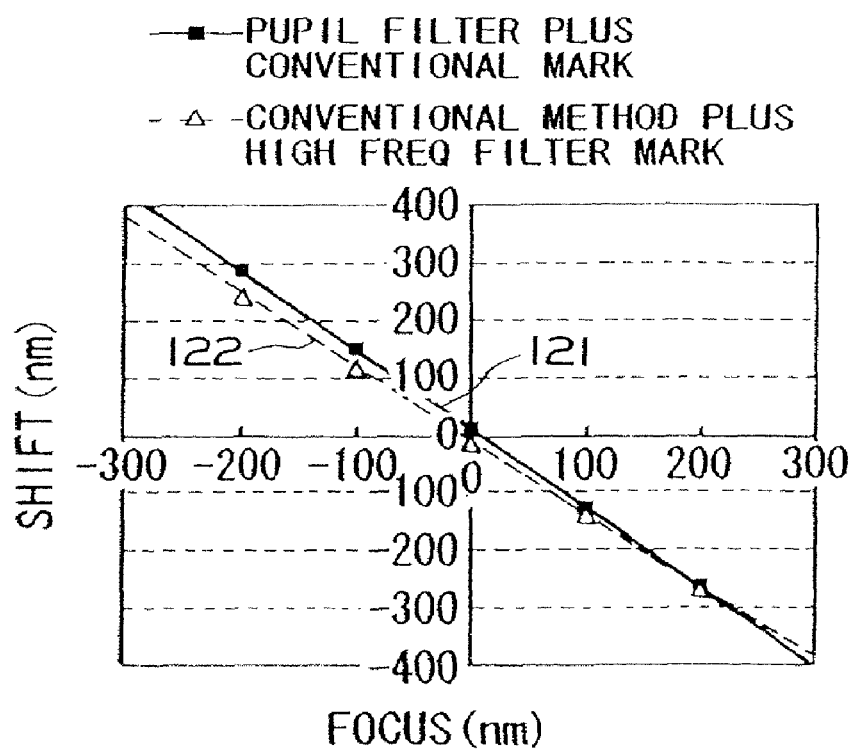
FIG. 19 illustrates a relation between an optical axis direction (Z position) and lateral deviation of a pattern.

FIG. 19 illustrates the result of simulation for such measurement. Curve 122 depicts the result of measurement in Embodiment 3, using the patterns 151 and 152. Since it showed substantially the same straightness as that of the result (curve 121) of using a pupil filter as described above, the advantageous effect thereof has been confirmed. More specifically, the test pattern of Embodiment 3 comprises a pattern such as shown in FIG. 12, 13, 15 or 16, for example, and it includes a pattern adapted so that diffraction patterns produced on the pupil plane of an optical system (projection lens) are cancelled with each other such that high frequency components are reduced. Namely, also this test pattern is provided with an opening Ma as well as periodic openings Mb1, Mb2, . . . (see FIG. 2) at the boundary with the opening Ma, for producing periodic components different from that of the opening Ma, on the pupil plane of the optical system. Therefore, this test pattern, that is, the test pattern TP, functions to direct substantially only zeroth order light toward the image plane through the pupil plane of the projection optical system. For this reason, even if the projected image is defocused and also the optical system has wavefront aberration, no asymmetrical distortion is created in the projected image.

In accordance with these embodiments as described hereinbefore, even if a test pattern is obliquely illuminated, measurement of best focus, astigmatic aberration and curvature of field can be accomplished without being influenced by aberration of the projection optical system. Further, the advantageous effect thereof can be optimized with regard to various pattern sizes to be measured or to various numerical apertures (NA) of projection lenses of exposure apparatuses. High-throughput and high-precision measurement are attainable.

Now, a description will be made of a wavefront aberration measuring method according to Embodiment 4 of the present invention. Here a description will be made with reference to a case wherein wavefront aberration of a projection optical system of a projection exposure apparatus, for projecting a circuit pattern of a reticle onto a photosensitive substrate (wafer), is going to be measured.

In Embodiment 4, to a pattern or pattern group (test pattern) TP formed on a reticle 9, illumination light whose principal ray has a certain angle and a certain direction is projected through an illumination optical system and a special optical element provided on the reticle. Then, the position of a test pattern image TPa, which may be an aerial image being defined by imaging the test pattern TP of the reticle 9 through the projection optical system or which may be an image transferred to a photosensitive substrate, is measured. The test pattern may not be provided on a reticle, and it may be formed on a separate reference plate. Here, as regards the aerial image to be measured or the pattern image TPa transferred to the photosensitive substrate, there may be more than one. Thus, by measuring positions of more than one aerial image or transferred pattern images, the wavefront of the projection optical system is measured. The positions of respective aerial images or transferred pattern images TPa depend on the positions of patterns upon the reticle or a reference plate, and these patterns are illuminated by illumination lights from different directions, which depend on the positions of the patterns.

In Embodiment 4, to the test pattern TP formed on a reticle, illumination light having a principal ray LP with its direction of incidence extending in a predetermined direction is projected by an illumination optical system. Then, the position of a test pattern image TPa which may be an aerial image being defined by imaging the test pattern TP of the reticle through the projection optical system or which may be an image transferred to a photosensitive substrate, is measured. Subsequently, while changing the incidence direction of the principal ray of the illumination light, the illumination light is projected to the test pattern on the reticle. Then, the position of a test pattern image TPa which may be an aerial image defined by imaging the test pattern through the projection optical system or which may be an image transferred to a photosensitive substrate, is measured. As regards the position of each test pattern image TPa transferred to the photosensitive substrate, after the photosensitive substrate is developed, the position of the developed test pattern image (resist pattern) TPa is measured.

On the basis of the results of measurement in regard to the position of the aerial image of the test pattern TP or the position of the developed pattern image thereof, the wavefront aberration on the pupil plane 10a of the projection optical system is measured.

The test pattern TP of this embodiment comprises a periodic pattern (line-and-space pattern) in which the pitch (interval) of the lines or of the spaces is substantially uniform. Additionally, the individual widths of the spaces through which light can pass decreases, along a direction from the line or space pattern at the center of the periodic pattern toward the line or space pattern at the outside periphery of the periodic pattern. In a light intensity distribution of a pattern image obtained when this pattern is imaged by a projection lens, adjacent lines are not resolved, and also, it can be regarded as a single large pattern (image) with small distortion.

In this embodiment, the position of this aerial image or a pattern image transferred to the photosensitive substrate is measured, as an amount of positional deviation from a certain reference position Then, tilt of the wavefront corresponding to this positional deviation is detected and, on the basis of it, the wavefront aberration is detected.

In greater detail, the Embodiment 4 uses a test pattern having a structure described hereinbefore. On the basis of the amount of positional deviation of an image of the test pattern being illuminated by oblique incidence illumination as well as the projection direction (incidence angle and azimuth angle) of the principal ray of the illumination light, projected to the test pattern, a tilt of the wavefront at a certain position corresponding to the projection direction, on the pupil coordinates of the projection lens, is detected with a good precision. Based on this, the wavefront aberration is detected.

Figure 22:
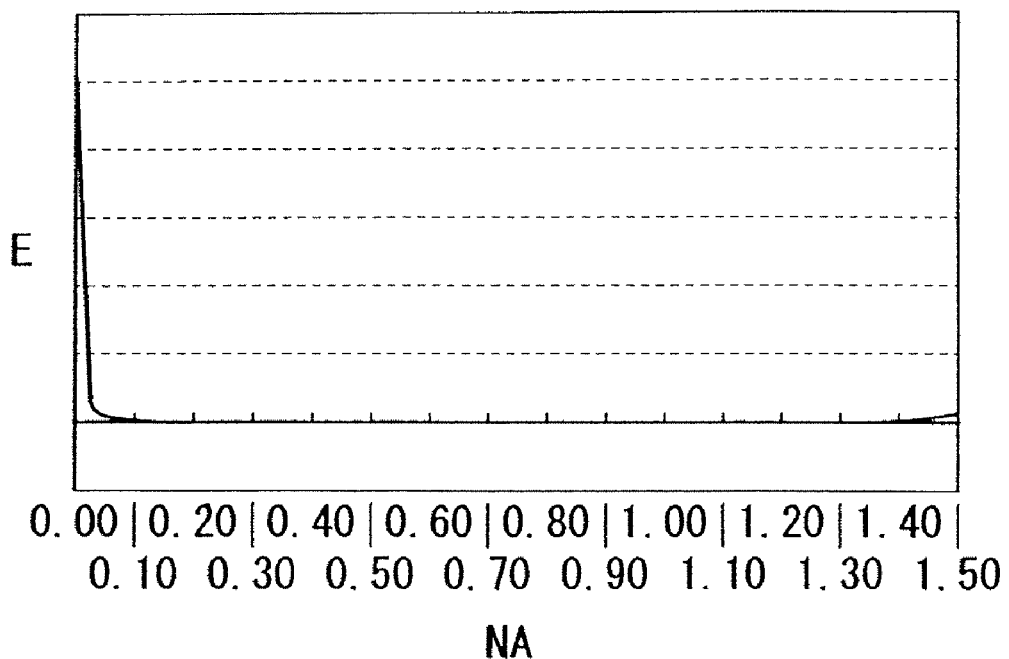
FIG. 22 illustrates a measurement object spectrum upon a pupil plane.

Next, a description will be made of the object spectrum of a test pattern to be formed on a pupil plane of a projection optical system, where wavefront aberration of the projection optical system is measured by use of a test pattern according to the present invention. If a resolving power of measurement is taken into account, the object spectrum on a pupil plane to be obtained should desirably have a shape as that of a δ function. It should be noted, however, that, with only a peak as a δ function, no image of the test pattern is produced. In practice, taking into account that the numerical aperture NA of a projection lens is on an order of 0.6 to 0.8, it may be an object spectrum ω as having a shape to be accommodated within a numerical aperture (NA) of 0.1 on the pupil plane, such as shown in FIG. 22, for example.

Next, the section for such an object spectrum is considered. When the numerical aperture NA of a projection lens is 0.7, while the center of the object spectrum is taken as zero, it is sufficient that the shape of the object spectrum is held in the section of −1.4<NA<+1.4.

Taking this into account, whether it is possible to design a pattern which satisfies the above-described condition on the basis of a reticle pattern (test pattern) only, and without using a pinhole, to be described later, or not will be described. The measuring method to be taken is the oblique incidence illumination method described hereinbefore.

Figure 23:
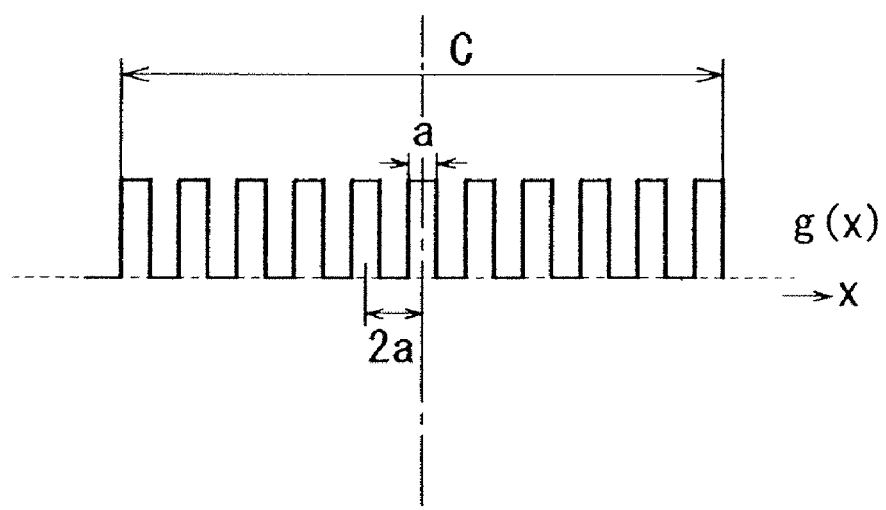
FIG. 23 illustrates a one-dimensional light intensity distribution of an object image.

FIG. 23 illustrates a light intensity distribution of a one-dimensional repetition pattern comprising lines and spaces wherein the width of each of the lines and spaces is a and wherein the ratio of the line width and the space width is 1:1. If a rectangular function shown in FIG. 23 is g(x) and its Fourier transform is G(f), it is sufficient that the object spectrum shape on the pupil plane of the projection optical system is considered only in relation to G(f). Here, G(f) can be approximately expressed as follows.

$$G(f)=2a2C\cdot\text{sinc}(af)\cdot\text{III}(2af)*\text{sinc}(cf) \quad (2)$$

III: shear function
*: convolution integration
C: pattern length (length of pattern)

In equation (2) above, as C (constant) increases to infinity, sinc(cf) becomes a δ(f) function. Then, G(f) is expressed by:

$$G(f)=2a2c\cdot\text{sinc}(af)\cdot\text{III}(2af) \quad (3)$$

Figure 24:
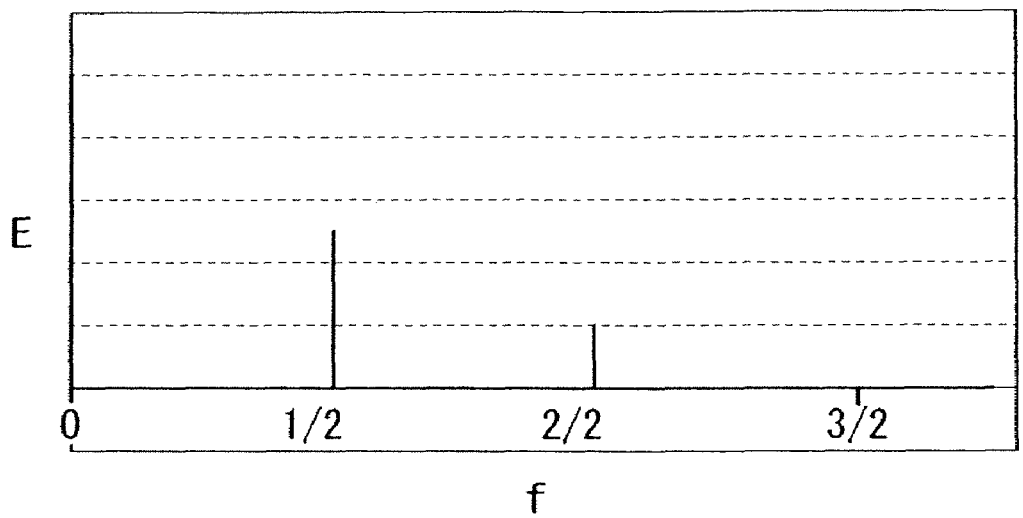
FIG. 24 illustrates an object spectrum on a pupil plane.
Figure 25:
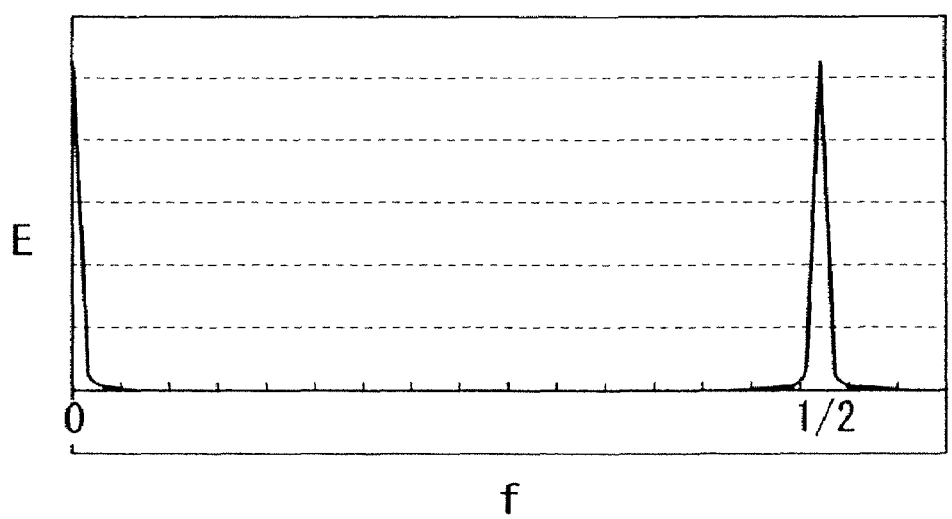
FIG. 25 illustrates an object spectrum on a pupil plane.

From equation (3) above, at a period ½(a) shown in FIG. 24, G(f) becomes an object spectrum having an amplitude only with f=n/(2a) (n is an integer). FIG. 24 shows an object spectrum on the pupil plane. Thus, by choosing the line and space width a with which NA=½aλ≧1.6 (λ is exposure wavelength) is satisfied, a desired spectrum can be obtained on the pupil plane. However, it is practically unreasonable for the object spectrum on the pupil plane such as shown in FIG. 25 to take a sufficient size for c to avoid amplitude in the spatial frequency section f of 0<f<1/(2a), that is, to suppress high order components, particularly, when considered from the standpoint of the region (isoplanatic patch) that can be regarded as being of the same image height, or in view of the size of a pattern to be measured or of the specification or precision of positional deviation measuring tools currently available. In consideration of this, a condition to assure that high order components are suppressed, without taking c as being large, is desired.

Figure 26:
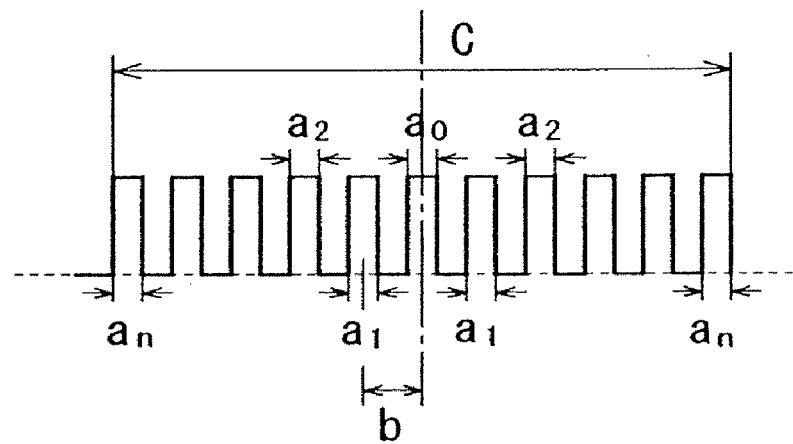
FIG. 26 illustrates a one-dimensional light intensity distribution of an object image.

Next, a pattern having a light intensity distribution such as shown in FIG. 26 is considered. What differs from the pattern shown in FIG. 23 is that, although the pitch b of lines is uniform (constant), there is a degree of freedom of changing the line width a. The Fourier transform of the rectangular function shown in FIG. 26 can be expressed also as follows.

$$G(f)=a0\cdot\text{sinc}(a0f)+2\Sigma i=1\ i=n\ ai\cdot\text{sinc}(ai\ f)\cos(2\pi ibf) \quad (4)$$

2n: number of lines
b: pitch (spacing)
a0, a1, a2: line width

Here, the Fourier series of Σi pi·cos(if) is considered. The Fourier series is converged as follows.

$$i=\infty\Sigma pi\cdot\cos(if)=\{p\cdot\cos(f)-p2\}/\{1-2p\cdot\cos(f)+i=1p2\}$$
(where |p|<1) (5)

In Embodiment 4, the test pattern is designed while taking the graph shape of equation (5) above as a goal. Thus, when equation (5) is applied to equation (4), from equation spreading, a relation between a test pattern to be designed and an object spectrum to be produced thereby is obtainable. Here, variables produced are α and P, and they are intermediate variables (mediation) for relating the aforesaid pattern and the object spectrum with each other. When the pattern is designed while taking P (0<P<1) at a value close to 1, the object spectrum becomes steep, and higher precision measurement becomes possible. However, with n-power of P, since P is close to 1, the object spectrum to be obtained does not approximate to equation (7), i.e., the goal, in view of a practical pattern length C. In consideration of this, in practice, P is discarded and equation (9), approximating to the n-power of P and nearing zero quickly, is used for the designing. In this sense, taking n larger means that equation (9) approximates to a state in which P in equation (8) becomes close to 1, and therefore, a steeper spectrum is obtainable thereby.

Figure 27:
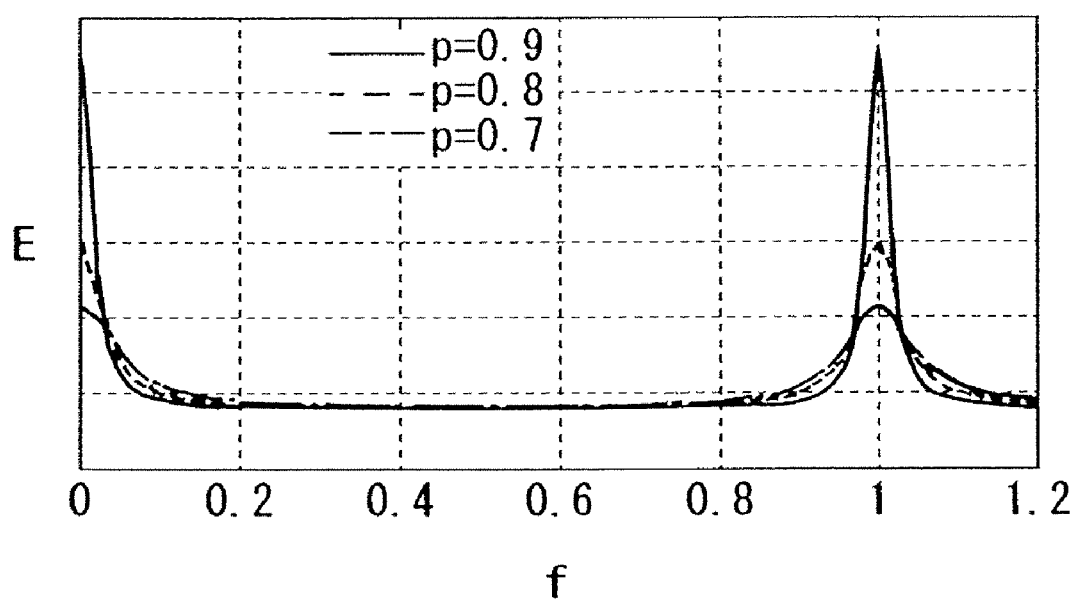
FIG. 27 illustrates an infinite Fourier series.

Equation (5), when graphed, is such as illustrated in FIG. 27. It is seen that curves in FIG. 27 have a shape in which the amplitude to f between peaks involves an approximately constant offset, and they are a curve near a desired spectrum shape not having irregularities. Also, it is seen from the graph that, since convergence is near even at a stage where the value of n is not large, it can be said that, even if the pattern length c of the whole pattern is small, high order components can be suppressed sufficiently. In consideration of this:

$$ai\cdot\text{sinc}(aif)\sim\alpha pi$$

$$a0\cdot\text{sinc}(a0f)\sim 2\alpha p2/(1+p2) \quad (6)$$

are assumed. From equation (6), the left-hand side is the function of f with respect to i, whereas the right-hand side is a constant. It follows from this that equation (6) applies only with respect to a particular f. Here, the effective range for f will be explained. The f-region wherein approximation as described above should be done is present between peaks, and it is |f|<1/b. Since ai<b is held in this range, ai·sinc(aif) is a monotone decreasing function. Also, if ai is sufficiently smaller than b, ai·sinc(aif) becomes substantially constant and it can be regarded as a constant. From the above, if equation (4) is rewritten by using equation (6), it follows that, within the range of |f|<1/b and when n→∞, $$G(f)\rightarrow 2p2/(1+p2)+2\alpha\{p\cdot\cos(2\pi bf)-p2\}/\{1-2p\cdot\cos(2\pi bf)+p2\} \quad (7)$$

Figure 28:
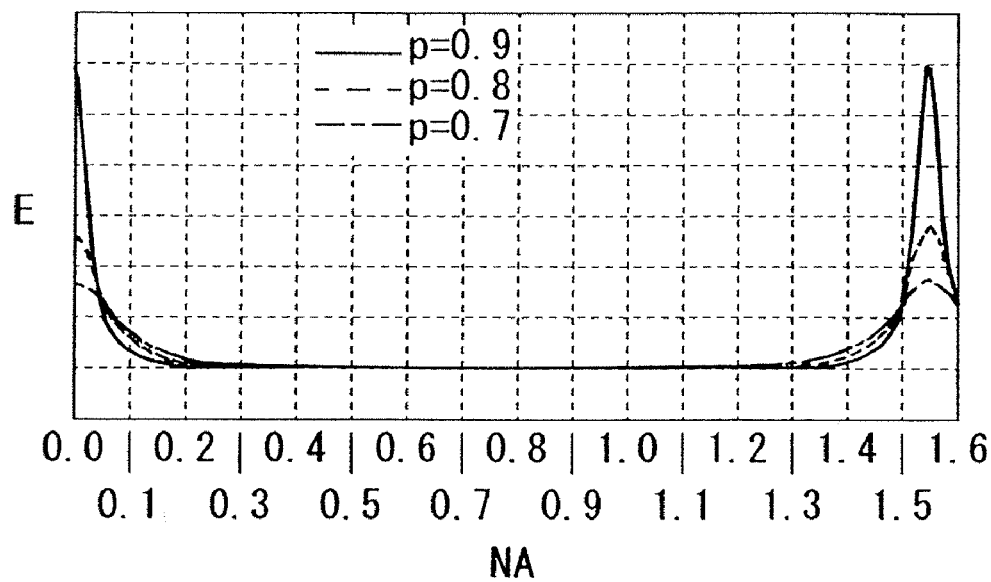
FIG. 28 illustrates an object spectrum on a pupil plane.

When equation (7) is graphed by using appropriate α and p, the result is such as shown in FIG. 28. FIG. 28 illustrates an object spectrum on a pupil plane.

Subsequently, ai is determined in practice. From the assumption described above, $$ai=\alpha pi$$

$$a0=2\alpha p2/(1+p2) \quad (8)$$

By choosing values for α and p moderately, ai is determined. However, depending on p given, the shape of the object spectrum differs. FIG. 7 illustrates this. If p is taken as 0<p<1, the peak of the object spectrum becomes steeper when p is made closer to 1, and higher resolution measurement is possible. Also, since α is not effective to the signal to noise ratio (S/N) of the object spectrum, it is desirable to make the same as large as possible to keep the light quantity.

Figure 29:
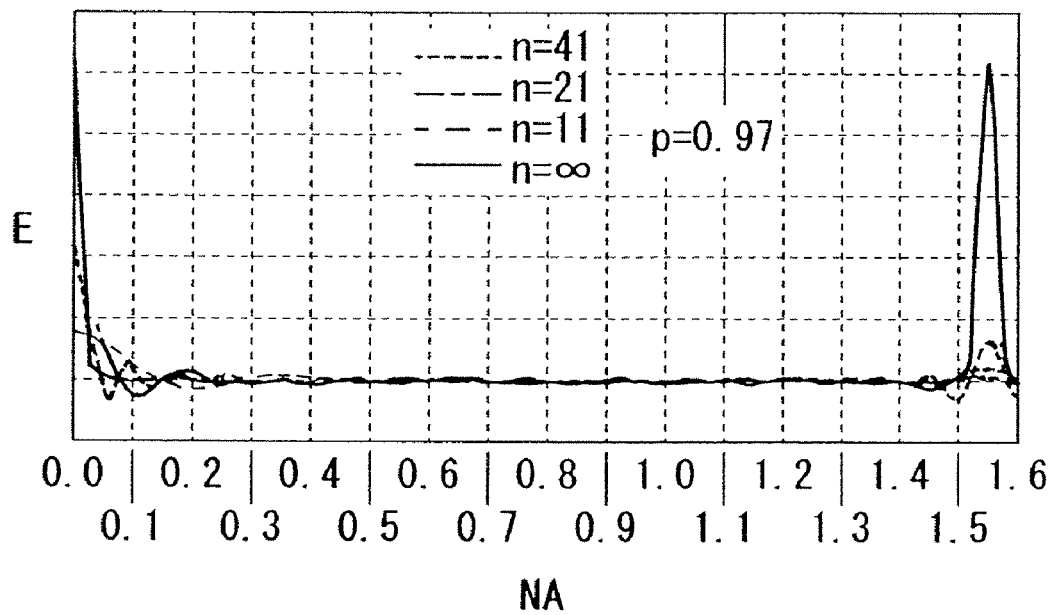
FIG. 29 illustrates a relation between the number of patterns and the object spectrum on a pupil plane.

Since equation (7) applies when n →∞, if p is made close to 1, αpn does not become close to zero, and equation (7) is not approachable. The graph of FIG. 29 illustrates that, as the number of lines of the pattern increases, the amplitude of high order components is suppressed to be small. It is seen from the graph of FIG. 29 that, in order to make αpn close to zero to some degree, a substantial length c is required for the whole pattern. In consideration of this, in practice, it is a possible way to use a function with which it can be kept in an appropriate pattern length c near the condition of equation (8).

Figure 30:
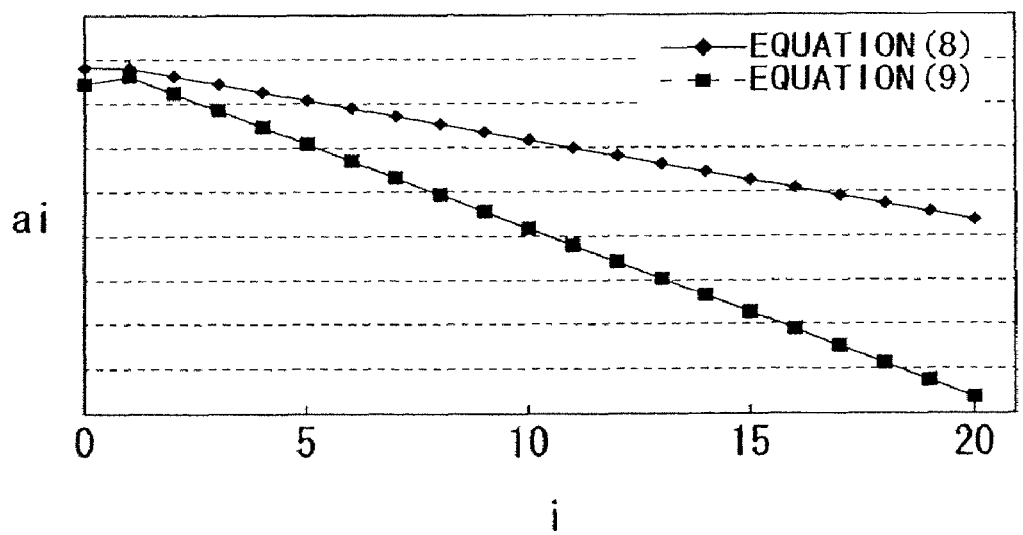
FIG. 30 illustrates a relation between the number of patterns and the pattern width.
Figure 31:
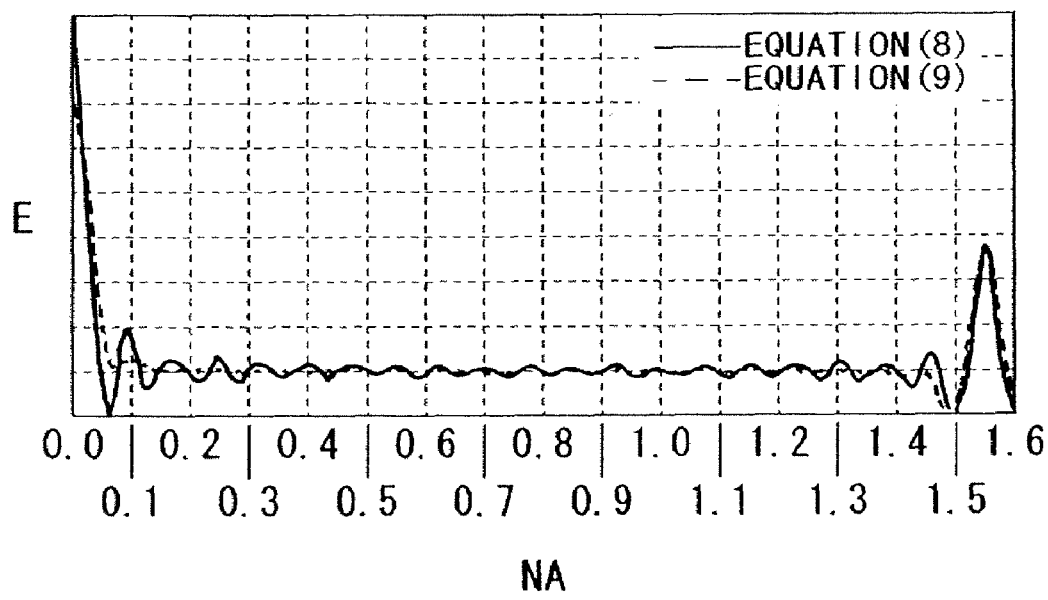
FIG. 31 is a comparative illustration of an object spectrum on a pupil plane.

For example, if the length of the whole pattern should be kept at c0, then, from the numerical aperture NA0 of the projection lens to be measured, the interval b0 (<2NA0/λ) of the spacings within the above-described pattern is determined. Then, from b0·n=c0, the number of spaces, i.e., 2n+1, is determined. It is possible that, when ai=αpi in equation (8) is taken as $$ai = \alpha(1 - i/(n+1)) \qquad (9)$$

that is, as a linear decreasing series, convergence is facilitated. Here, a0 is so determined that an average value of peak interval (|f|<1/b0) becomes equal to zero. FIG. 30 shows a comparison between equation (8) and equation (9) when p=0.197 and −21. Also, FIG. 31 shows a Fourier transform with patterns produced with them. It is seen from the graph that equation (9) is superior.

The wavefront aberration measuring method disclosed in this application uses a test pattern which is designed, in accordance with the concept described above, so as to optimize the shape of an object spectrum to be produced on a pupil plane of a projection optical system. By this, substantially only zeroth order light can be directed to an image plane through the pupil plane, without use of a pinhole on the pupil plane or at any other location within the imaging system, as in the Hartman method, such that high precision measurement of wavefront aberration is assured.

Next, a description will be made of a wavefront aberration measuring method in which such a test pattern and oblique incidence illumination are used practically.

Figure 33:
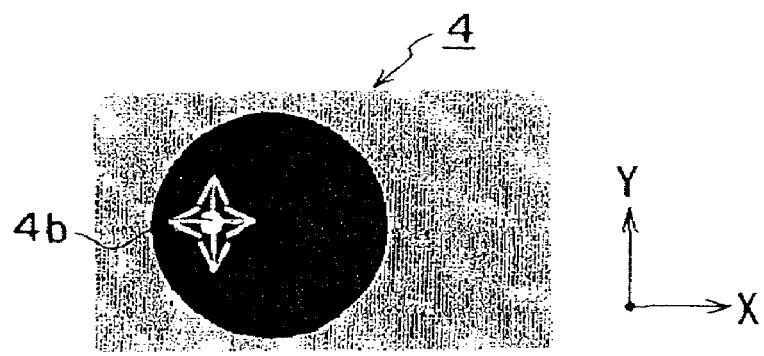
FIG. 33 illustrates a stop 4 in FIG. 32.

Referring to FIGS. 9, 11 and 33, an embodiment of a wavefront aberration measuring method according to the present invention will be explained. This embodiment concerns a case in which, in a projection exposure apparatus, wavefront aberration of a projection optical system thereof is measured.

This embodiment is applicable not only to a projection exposure apparatus having a projection optical system using lenses but also to various projection exposure apparatuses having a projection optical system using mirrors or one using lenses and mirrors in combination.

The projection exposure apparatus shown in FIG. 9 has the structure and function as has been described with reference to the preceding embodiments. Also, the detection system 11 shown in FIG. 11 is mounted on a wafer stage 12, for detection of the position of an image of a test pattern, as has been described in the preceding embodiments.

Figure 32:
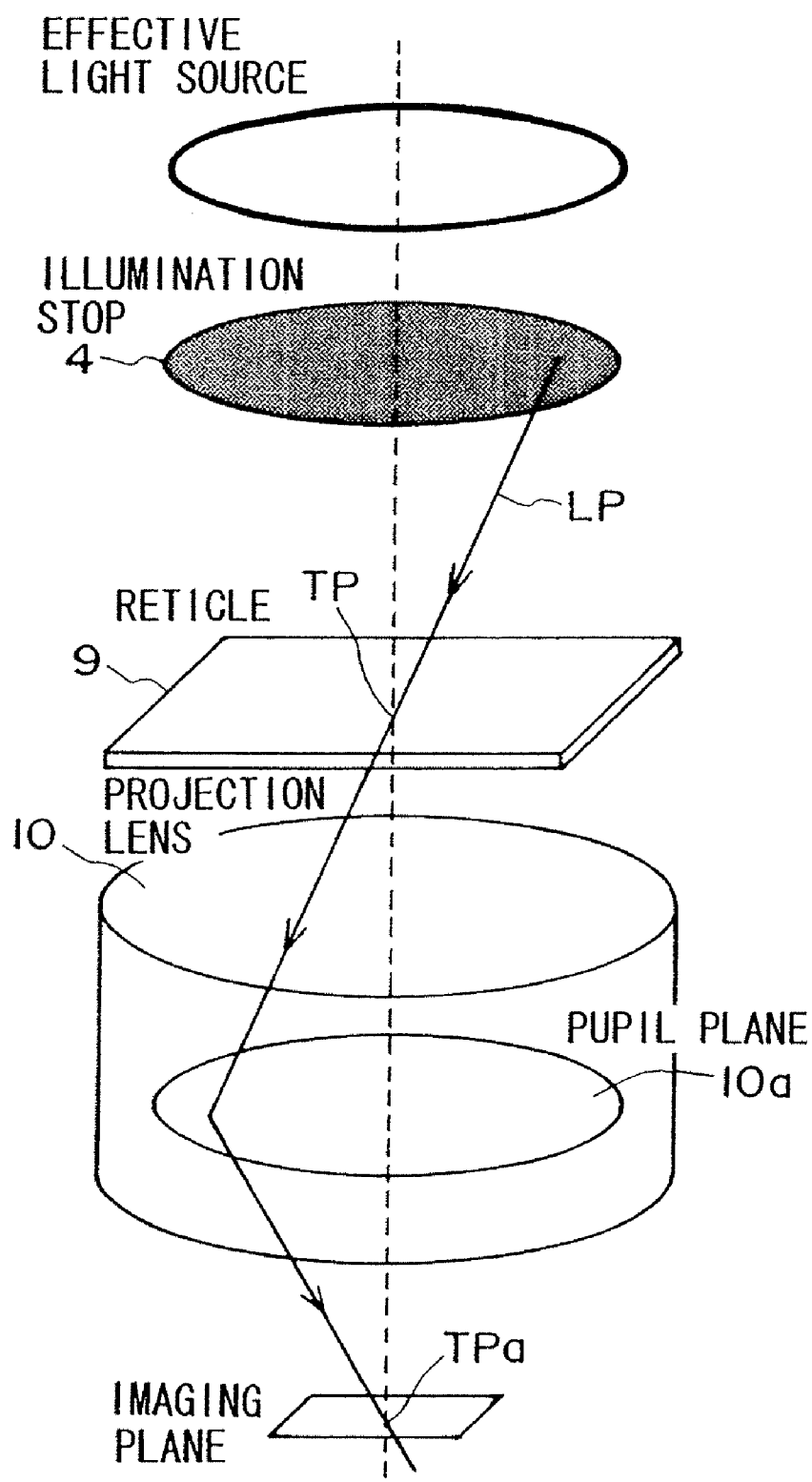
FIG. 32 illustrates an oblique incidence information method.

FIG. 32 is a perspective view for explaining the manner of oblique incidence illumination of a test pattern, for measurement of wavefront aberration of the projection optical system in the projection exposure apparatus of FIG. 9.

In FIG. 32, an aperture stop 4 is driven by a driving system 4a (FIG. 9), So that, as shown in FIG. 33, for example, the position of its opening 4b can be changed freely in the X and Y directions. With this arrangement, the reticle incidence angle or direction of the principal ray of the illumination light can be changed freely. Therefore, over the whole pupil plane of the projection lens 10, it is possible to concentrate the principal ray of the illumination light at a desired position where the measurement is just to be done. Also, the aperture stop 4 has a variable aperture diameter.

Figure 34:
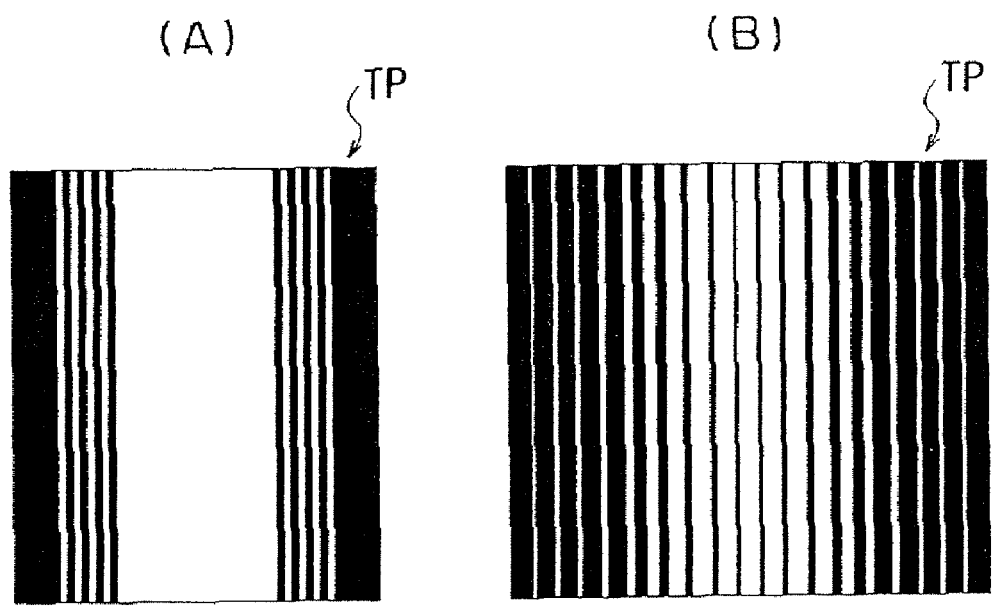
FIG. 34 illustrates a test pattern according to Embodiment 4 of the present invention.
Figure 35:
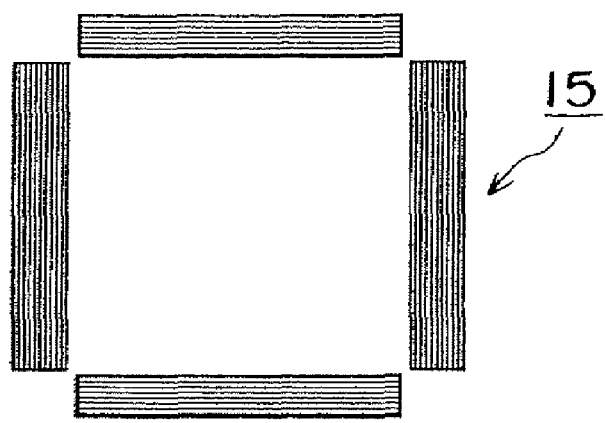
FIG. 35 illustrates a general structure of a test pattern according to Embodiment 4.
Figure 36:
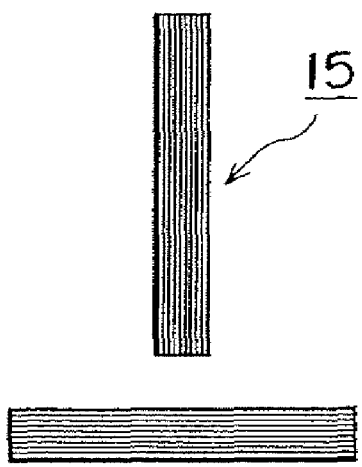
FIG. 36 illustrates a general structure of a test pattern according to Embodiment 4.

FIG. 34 shows details of a test pattern TP used in this embodiment. The test pattern TP of FIG. 34 has been optimized with respect to a design wavelength 248 nm and a projection lens with a numerical aperture (NA) of 0.7, in accordance with the concept described hereinbefore. The test pattern to be used has a general structure such as shown in FIG. 35 or 36.

To the test pattern TP, first illumination light defined by the aperture stop 4 shown in FIG. 33 is projected from a predetermined direction, and an image of the test pattern TP is projected onto a plate 11a which is mounted on the wafer stage 12, through the projection optical system 10. By moving the wafer stage 12 along a plane (X and Y directions) orthogonal to the optical axis direction and in a direction parallel to the plane of incidence of the aforementioned first illumination light, a slit pattern 11b provided on the plate 11a is scanned. Light passed through this slit pattern is detected by using a photoreceptor 11c such as a light intensity detector or a light quantity detector, for example. Then, on the basis of respective positions (X, Y) of the wafer stage 12 in the plane (X and Y directions) orthogonal to the optical axis direction, obtained at that time, and of detection signals (FIG. 14) corresponding to the light intensity or the light quantity at these positions, the central position of the image TPa of the test pattern TP being imaged upon the plate 11a is calculated.

Then, the position of the aperture 4b of the aperture stop 4 is shifted to another position. In that state, through a similar procedure like that of the first illumination light, but without changing the position in the Z direction, the test pattern TP is illuminated with light from a direction different from the first illumination light. Then, the central position of an image TPa of the test pattern upon the X-Y plane orthogonal to the optical axis direction is calculated. Further, a shift of the aperture 4b position and calculation of the central position of a pattern image are repeated until the whole pupil plane 10 of the projection lens 10 is covered.

Since the light pattern of an aerial image of the test pattern 15, also in this embodiment, is sufficiently large as a few microns, in place of the light intensity detector or the light quantity detector which requires stage scan as described above, a light receiving surface of a CCD or a linear sensor may be directly set at the imaging plane to receive the aerial image, without incorporating an enlarging optical system into the stage. On the basis of detecting the central position of this aerial image, the wavefront aberration can be measured.

The positional information (positional deviation information) of the thus obtained test pattern image TPa bears tilts of the wavefront at positions corresponding to respective positions on the pupil plane 10a of the projection lens 10. Calculation methods for creating the shape of the wavefront as a whole on the basis of tilts of the wavefront at respective positions inside the pupil plane are conventionally discussed in the literature, or the like, that is, for example, "Least-squares phase estimation from the phase difference" by H. Takajo and T. Takahashi. Therefore, also in this case, the wavefront of the projection lens 10 was created by calculations using plural positional information of the test pattern image TPa. It should be noted that, if Zernike polynomial approximation processing is carried out, the wavefront aberration can be expressed in terms of a Zernike coefficient at each term.

Practically, simulations were made and a certain wavefront was given by the Zernike polynomial. On the other hand, while using a test pattern TP, positional deviations of pattern images TPa formed under the oblique incidence illumination carried out from some directions were calculated. Through a simple calculation operation to be described below, Zernike coefficients were calculated. Then, the degree of consistency, between the calculation results and Zernike coefficients set by the above-described Zernike polynomial, was examined.

The wavefront as set by the above-described Zernike polynomial is C6 (0.05λ), C7 (0.05λ), C8 (0.02λ) and C9 (0.03λ). Here, Cn (n=6 to 9) represents a coefficient of the n-th term of the Zernike polynomial (as standardized with respect to r=1, where r is the radius of the pupil polar coordinates and $0 \leq r \leq 1$). The numerical aperture (NA) of the projection lens was 0.7, and the incidence angle r of the oblique incidence illumination and the azimuth angle θ were r=0.07, and 0.9, and θ=0, π/2, π, and 3π/2, thus a total of nine conditions. Positional deviations under these conditions are represented by dx1, . . ., and dx9 and dy1, . . ., and dy9. The tilt of the wavelength at each pupil coordinate position where the principal ray passes when illuminated under these illumination conditions can be expressed in terms of the sum in each Zernike term in x and y directions, while using variables conversion, as follows.

$$\partial W/\partial x = 4r \cos \theta \cdot C4 + 2r \sin \theta \cdot C6 + \{6r^2 \cos 2\theta + 3r^2 - 2\} \cdot C7 + 6r^2 \sin \theta \cdot \cos \theta \cdot C8 + 12r \cos \theta \cdot \{2r^2 - 1\} \cdot C9$$

where W is wavefront aberration.

Similarly, $$\partial W/\partial y = 4r \sin \theta \cdot C4 + 2r \cos \theta \cdot C6 + 6r^2 \sin \theta \cdot \cos \theta \cdot C7 + \{6r^2 \sin 2\theta + 3r^2 - 2\} \cdot C8 + 12r \sin \theta \cdot \{2rr^2 - 1\} \cdot C9$$

Based on the above, the following matrix formula was prepared and respective Cn coefficients were calculated.

$$\begin{bmatrix} dx1 \\ dx2 \\ \vdots \\ dx9 \\ dy1 \\ dy2 \\ \vdots \\ dy9 \end{bmatrix} = \lambda/NA \cdot \begin{bmatrix} p41 & p61 & p71 & p81 & p91 \\ p42 & p62 & p72 & p82 & p92 \\ \vdots & \vdots & \vdots & \vdots & \vdots \\ p49 & p69 & p79 & p89 & p99 \\ q41 & q61 & q71 & q81 & q91 \\ q42 & q62 & q72 & q82 & q92 \\ \vdots & \vdots & \vdots & \vdots & \vdots \\ q49 & q69 & q79 & q89 & q99 \end{bmatrix} \cdot \begin{bmatrix} C_4 \\ C_6 \\ C_7 \\ C_8 \\ C_9 \end{bmatrix}$$

Here, dxj and dyj are positional deviations on the pupil plane corresponding to the incidence angle of the oblique incidence illumination and the azimuth angle j, pij and qij are fine coefficients of respective Zernike terms, NA is the numerical aperture of the projection lens, and λ is the wavelength. The results are as shown below.

TABLE 1

| | | CALCULATION RESULT | | |
|---|---|---|---|---|
| | SET LENS WAVEFRONT (λ) | INVENTION NA 0.64 | INVENTION NA 0.73 | PUPIL FILTER NA 0.73 |
| C6 COEFF | 0.05 | 0.050 | 0.050 | 0.050 |
| C7 COEFF | 0.05 | 0.047 | 0.050 | 0.050 |
| C8 COEFF | 0.02 | 0.019 | 0.017 | 0.020 |
| C9 COEFF | 0.03 | 0.028 | 0.029 | 0.030 |

It is seen from the above that this measuring method has a sufficient measurement precision for detection of Zernike coefficients (lens aberration). Further, in this measuring method, if the number of measurement points on the pupil plane (i.e., the number of oblique incidence illuminations) is enlarged, additional improvements in precision or measurement of higher order aberration are attainable. To the contrary, when measurement points on the pupil plane (oblique incidence illumination) are selected while paying specific attention to the Zernike coefficients which are just to be obtained, desired aberration can be measured at a higher throughput. This is effective to automatic correction of aberration of a projection optical system in an exposure apparatus.

Further, plural test patterns TP may be provided at plural locations on the reticle 9. In that case, in accordance with the procedure described above, exposures of these patterns may be performed and wavefront aberrations at different image heights can be measured. Thus, by actuating a correction optical system in a projection optical system 10, automatic aberration correction of the projection optical system can be accomplished.

Figure 37:
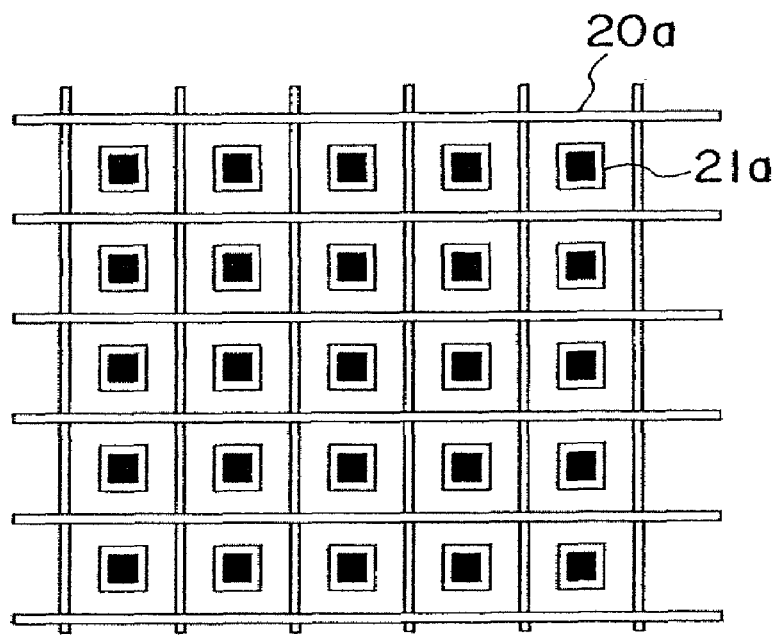
FIG. 37 illustrates a test pattern according to Embodiment 5 of the present invention.
Figure 38:
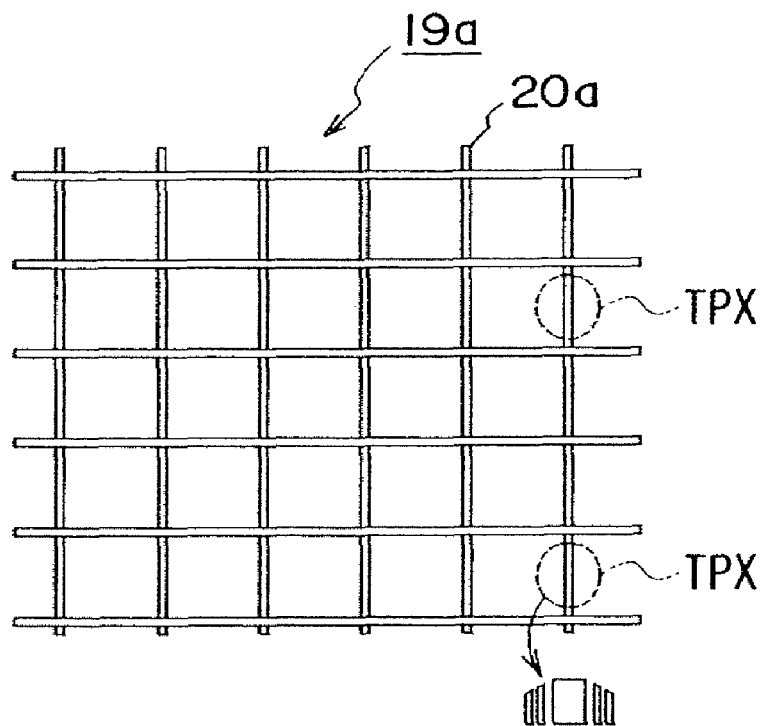
FIG. 38 illustrates a mark group 19a having its object spectrum controlled.

Next, a description will be made of Embodiment 5 of the present invention. Embodiment 5 will be described with reference to a specific example in which a test pattern TP is transferred to a photosensitive substrate (wafer) W and wavefront aberration is measured. A test pattern 19a to be used differs from that of Embodiment 4, and it comprises a mark 20a which can be seen as shown in FIG. 37 when superposed with marks 21a (reference pattern). A positional deviation between these marks is measured, in relation to each of the grids TPX of the mark 20a. FIG. 38 shows a mark group 19a including the mark 20a, while FIG. 39 shows a mark group 19b including the mark 21a.

In FIG. 38, each grid TPX has a pattern shown in FIG. 34(A) or 34(B). The grating lines (grids) of FIG. 38 are designed with the same linewidth, and the linewidth is the same as that shown in FIG. 35 or 36.

Figure 39:
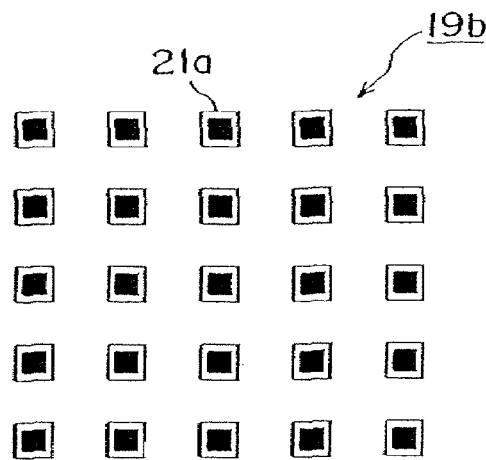
FIG. 39 illustrates a mark group 19b as a reference pattern.

As regards the linewidth of each mark 21a of FIG. 39, there is no specific limitation. When the pattern dependency of a measuring tool for measuring transferred patterns of marks 21a and 21b is taken into account, the final linewidth to be defined after developing a transferred image of the mark 21a, transferred to a photosensitive substrate, should preferably be approximately the same as the grid width of FIG. 38. Here, the linewidth of each mark 21a was two microns.

Figure 40:
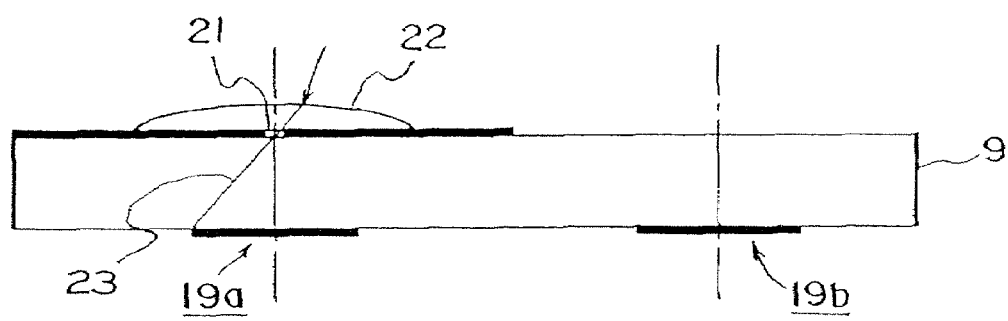
FIG. 40 illustrates a reticle 9 having mark groups 19a and 19b.

Disposed on an upper glass surface of the mark group 19a (test pattern) shown in FIG. 38, is a pinhole 21 which is disposed at a position coincident with the central position of the mark group shown in FIG. 40. This pinhole 21 has a function for applying restriction to the tilt of the principal ray of illumination light, illuminating the test pattern, in relation to each of dispositions (positions) of the marks TPX on the lower glass surface. There is no necessity of shifting the position of the aperture 4b of the aperture stop 4 of the illumination system as in Embodiment 4. When large-σ illumination is carried out to the reticle 9, the marks TPX can be illuminated with illumination lights from different directions, simultaneously, and they are transferred to the photosensitive substrate in a batch.

Here, if the incidence angle of the large-σ illumination light to be supplied from the illumination system is not greater than σ1.0 and where an incidence angle σ of illumination light not less than 1.0 is necessary for the measurement, as shown in FIG. 40, a convex lens 22 may be provided above the pinhole 21 to collect the illumination light more. In that case, the pupil plane 10a as a whole of the projection lens 10 can be covered. Further, in FIG. 40, since each mark 21a of the mark group 19b is used as a reference, there is no pinhole or convex lens on the upper glass surface thereof. It should be noted that the light ray 23 shown in FIG. 40 represents the light having a largest incidence angle, among plural illumination lights impinging on the mark group 19a.

Next a description will be made of the exposure sequence of a test pattern using the reticle 9 of FIG. 40. The marks 20a and 21a are exposed under an ordinary illumination condition (α>0.7). Subsequently, the wafer stage 12 is moved so that the marks 20a and 21a are superposed one upon another, and these marks are exposed similarly under the ordinary illumination condition. Then, the photosensitive substrate W is developed and, after it, with respect to each of the grids, a relative positional deviation between the thus transferred marks 20a and 21a is measured by use of a measuring tool. By performing calculation processing to the thus obtained plural positional deviations, a wavefront is created. In regard to this wavefront, approximation such as a Zernike polynomial, for example, is carried out. Then, coefficients for Zernike terms are calculated, and the wavefront aberration is detected.

The above-described test patterns (20a, 19a, 21a, 19b) may be provided at plural locations on one and the same reticle or on separate reticles. In that case, the procedure including exposure, measurement and calculation may be carried out as described above, and the wavefront aberration for different image heights can be measured.

INDUSTRIAL APPLICABILITY

In accordance with respective embodiments described above, oblique incidence illumination and an optimized test pattern are used, by which high precision measurement of wavefront aberration can be accomplished without use of a pinhole in a projection lens. The advantageous effect can be optimized with respect to various pattern sizes to be measured, or various numerical apertures (NA) of projection lenses of exposure apparatuses. Thus, high-throughput and high-precision measurement is attainable.

Further, when the measurement result of wavefront aberration is fed back to an aberration correcting system of an exposure apparatus, an exposure apparatus arranged for automatic aberration correction or aberration setting optimized for actual devices can be accomplished.

The invention claimed is:

1. A wavefront aberration measuring method for measuring wavefront aberration of a projection optical system, said method comprising:

providing a reticle having lines and spaces in which, with respect to a repetition direction thereof and from a center to a periphery, a pitch of the spaces is substantially constant while widths of the spaces gradually decrease and in which adjacent lines are not resolvable by the projection optical system;

projecting light fluxes to the lines and spaces from different directions, whereby plural images of the lines and spaces are formed through the projection optical system; and detecting respective positions of the plural images and detecting, by use of the result of the detection, the wavefront aberration of the projection optical system.

2. A wavefront aberration measuring method for measuring wavefront aberration of a projection optical system, said method comprising:

providing a reticle having plural patterns each comprising lines and spaces in which, with respect to a repetition direction thereof and from a center to a periphery, a pitch of the spaces is substantially constant while widths of the spaces gradually decrease and in which adjacent lines are not resolvable by the projection optical system;

projecting light fluxes to the plural patterns from different directions, whereby plural images of the patterns are formed through the projection optical system; and detecting respective positions of the plural patterns and detecting, by use of the result of the detection, the wavefront aberration of the projection optical system.

3. An optical characteristic measuring method for measuring an optical characteristic of a projection optical system, said method comprising:

supplying a reticle having a test pattern while a member having an opening is supplied, wherein the test pattern has lines and spaces for directing substantially only zeroth order light to an image plane of the projection optical system;

projecting a light flux to the test pattern through the opening, from an oblique direction, thereby to form an image of the pattern through the projection optical system; and detecting a position of the pattern image and detecting, by use of the result of the detection, the optical characteristic of the projection optical system.

4. A wavefront aberration measuring method for measuring wavefront aberration of a projection optical system, said method comprising:

supplying a reticle having plural patterns while a member having an opening is supplied, wherein each of the plural patterns has lines and spaces for directing substantially only zeroth order light to an image plane of the projection optical system;

projecting light fluxes to the plural patterns through the opening, from different directions, thereby to form images of the plural patterns through the projection optical system; and detecting respective positions of the pattern images and detecting, by use of the result of the detection, the wavefront aberration of the projection optical system.

5. A measuring method according to any one of claims 1-4, wherein the lines and spaces are adapted so that substantially only zeroth order light is directed to an image plane of the projection optical system.

6. A measuring method according to any one of claims 1-4, wherein said detecting step includes a step of photoelectrically converting an aerial image of the lines and spaces.

* * * * *

UNITED STATES PATENT AND TRADEMARK OFFICE
CERTIFICATE OF CORRECTION

PATENT NO. : 7,375,805 B2  
APPLICATION NO. : 11/614207  
DATED : May 20, 2008  
INVENTOR(S) : Yoshihiro Shiode Page 1 of 1

It is certified that error appears in the above-identified patent and that said Letters Patent is hereby corrected as shown below:

COLUMN 11:
    Line 24, "ap" should read -- σp --.

COLUMN 12:
    Line 17, "10b " should read -- 10b --.
    Line 62, "waferW." should read -- wafer W. --.

COLUMN 16:
    Line 50, "position Then," should read -- position. Then, --.

Signed and Sealed this

Fourth Day of November, 2008

JON W. DUDAS  
*Director of the United States Patent and Trademark Office*